US009429846B2

(12) United States Patent
Hatakeyama et al.

(10) Patent No.: US 9,429,846 B2
(45) Date of Patent: *Aug. 30, 2016

(54) PATTERN FORMING PROCESS AND SHRINK AGENT

(71) Applicant: SHIN-ETSU CHEMICAL CO., LTD., Tokyo (JP)

(72) Inventors: Jun Hatakeyama, Joetsu (JP); Masayoshi Sagehashi, Joetsu (JP); Teppei Adachi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 54 days.

This patent is subject to a terminal disclaimer.

(21) Appl. No.: 14/472,968

(22) Filed: Aug. 29, 2014

(65) Prior Publication Data

US 2015/0086929 A1    Mar. 26, 2015

(30) Foreign Application Priority Data

Sep. 26, 2013  (JP) ................................ 2013-200122

(51) Int. Cl.
*G03F 7/40* (2006.01)
*C08K 5/05* (2006.01)
*C08K 5/06* (2006.01)

(52) U.S. Cl.
CPC . *G03F 7/40* (2013.01); *C08K 5/05* (2013.01); *C08K 5/06* (2013.01)

(58) Field of Classification Search
CPC ....................................................... G03F 7/26
See application file for complete search history.

(56) References Cited

U.S. PATENT DOCUMENTS

| 6,136,500 A | 10/2000 | Kobayashi et al. |
| 6,579,657 B1 | 6/2003 | Ishibashi et al. |
| 7,537,880 B2 | 5/2009 | Harada et al. |
| 7,771,913 B2 | 8/2010 | Kaneko et al. |
| 2008/0090172 A1 | 4/2008 | Hatakeyama et al. |
| 2008/0153030 A1 | 6/2008 | Kobayashi et al. |
| 2010/0119717 A1 | 5/2010 | Hong et al. |
| 2014/0170563 A1 | 6/2014 | Hatakeyama |

FOREIGN PATENT DOCUMENTS

| JP | 10-73927 A | 3/1998 |
| JP | 3790649 B2 | 6/2006 |
| JP | 3991462 B2 | 10/2007 |
| JP | 2007-297590 A | 11/2007 |
| JP | 2008-111103 A | 5/2008 |
| JP | 2008-122932 A | 5/2008 |
| JP | 2008-158339 A | 7/2008 |
| JP | 2008-275995 A | 11/2008 |
| JP | 2014-11965 A | 1/2014 |

OTHER PUBLICATIONS

Yi et al., "Contact Hole Patterning for Random Logic Circuits using Block Copolymer Directed Self-Assembly", Proc. of SPIE, 2012, pp. 83230W-1-83230W-6, Vo. 8323, cited in the Specification.

*Primary Examiner* — Kathleen Duda
(74) *Attorney, Agent, or Firm* — Westerman, Hattori, Daniels & Adrian, LLP

(57) ABSTRACT

A negative pattern is formed by applying a resist composition onto a substrate, exposing the resist film, and developing the exposed resist film in an organic solvent developer. The process further involves coating the negative pattern with a shrink agent solution of a copolymer comprising recurring units having an α-trifluoromethylhydroxy or fluoroalkylsulfonamide group and recurring units having an acid labile group-substituted amino group in a $C_6$-$C_{12}$ ether, $C_4$-$C_{10}$ alcohol, $C_6$-$C_{12}$ hydrocarbon, $C_6$-$C_{16}$ ester or $C_7$-$C_{16}$ ketone solvent, baking the coating, and removing the excessive shrink agent for thereby shrinking the size of spaces in the pattern.

8 Claims, 2 Drawing Sheets

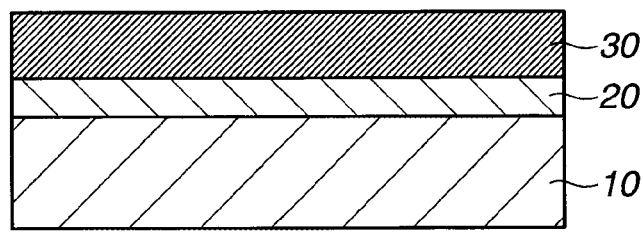
FIG.1A  COATING OF RESIST
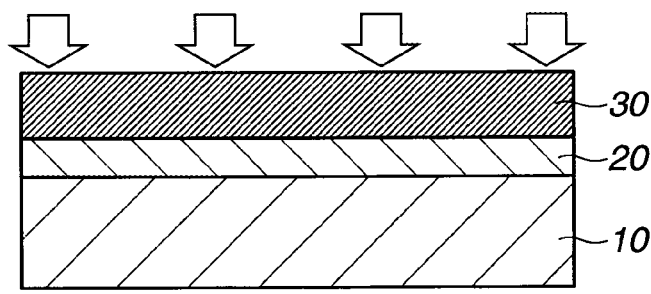
FIG.1B  EXPOSURE OF RESIST
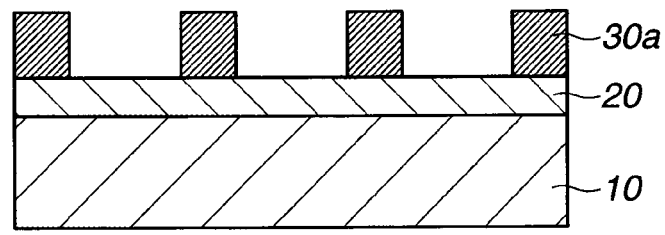
FIG.1C  PEB AND ORGANIC SOLVENT DEVELOPMENT TO FORM NEGATIVE PATTERN

PATTERN FORMING PROCESS AND SHRINK AGENT

CROSS-REFERENCE TO RELATED APPLICATION

This non-provisional application claims priority under 35 U.S.C. §119(a) on Patent Application No. 2013-200122 filed in Japan on Sep. 26, 2013, the entire contents of which are hereby incorporated by reference.

TECHNICAL FIELD

This invention relates to a pattern forming process comprising forming a resist pattern via resist coating, exposure and development, coating the resist pattern with a shrink agent, baking, and removing the excessive shrink agent for shrinking the size of spaces in the resist pattern.

BACKGROUND ART

While the effort to reduce the pattern rule is in rapid progress to meet the recent demand for higher integration density and operating speed of LSIs, the photolithography is on widespread use. The photolithography has the essential limit of resolution determined by the wavelength of a light source. One micropatterning approach to go beyond the limit of resolution is by combining ArF excimer laser immersion lithography with double patterning. One typical version of double patterning is litho-etch-litho-etch (LELE) process involving forming a pattern via exposure, transferring the pattern to a hard mask on a substrate by etching, effecting second exposure at a half-pitch shifted position, and etching the hard mask. This process has the problem of misalignment between two exposures or overlay error. Another version of double patterning is self-aligned double patterning (SADP) process involving the steps of transferring a resist pattern to a hard mask, growing a film on opposite sides of hard mask features, and leaving sidewalls of film for thereby doubling pattern size. The SADP process needs exposure only once and mitigates the problem of overlay error. To simplify the process, a modified version of the SADP process of forming a silicon oxide film on sidewalls of resist pattern features as developed rather than sidewalls of hard mask features for thereby doubling pattern size is also proposed. Since the SADP process is successful in reducing the pitch of line pattern to half, the pitch can be reduced to ¼ by repeating the SADP process twice.

Not only shrinking of line patterns, but also shrinking of hole patterns is necessary. Unless the hole pattern is shrunk, shrinkage over the entire chip is incomplete. One known method of shrinking a hole pattern is RELACS® method described in JP-A H10-73927. This method intends to reduce the size of a hole pattern by coating a resist pattern as developed with a water-soluble material containing a crosslinker, and baking the coating to form a crosslinked layer on the resist surface for causing the resist pattern to be thickened. JP-A 2008-275995 describes a shrink material comprising an amino-containing polymer or polyamine, which bonds to the resist surface via neutralization reaction with carboxyl groups on the resist surface, for thereby thickening the resist film. It is also proposed in Proc. SPIE Vol. 8323 p83230W-1 (2012) to shrink a hole pattern by utilizing the direct self-assembly (DSA) of a block copolymer.

Shrinkage by the RELACS® method has the problem that since a crosslinker becomes active with an acid catalyst within resist, the size of holes is non-uniform after shrinkage if acid diffusion is non-uniform. In the shrink method based on neutralization and bonding of amino polymer, the pattern is thickened as direct reflection of irregularities on the resist surface so that dimensional variations of the resist pattern as developed and dimensional variations after shrinkage are identical. The shrink method utilizing the DSA function of a block copolymer has advantages including an increased amount of shrinkage and a minimal dimensional variation after shrinkage, but some problems. Namely, if the DSA is applied to holes of different size, shrinkage cannot be induced for those holes of the size that causes a contradictory assembly of block copolymer. If the DSA is applied to a trench pattern, shape deformation becomes a problem, for example, a plurality of hole patterns are formed.

There is a need for a shrink agent which can shrink a trench pattern without changing its shape, and improve the dimensional variation and edge roughness (LWR) of a resist pattern as developed.

CITATION LIST

Patent Document 1: JP-A H10-73927 (U.S. Pat. No. 6,579,657)
Patent Document 2: JP-A 2008-275995 (US 20100119717)
Non-Patent Document 1: Proc. SPIE Vol. 8323 p83230W-1 (2012)

SUMMARY OF INVENTION

As discussed above, the method of applying a RELACS® material of crosslink type or neutralizing reaction-mediated bond type onto a resist pattern causes no pattern deformation, but fails to reduce the dimensional variation of the resist pattern. The DSA method can reduce the dimensional variation of a hole pattern as developed, but invites pattern deformation when applied to a trench pattern as developed.

An object of the invention is to provide a shrink agent which when applied to a resist pattern as developed, can reduce the dimensional variation of the resist pattern and when applied to a trench pattern, can shrink the trench size without causing pattern deformation; and a pattern forming process using the same.

The outstanding problems can be overcome by a pattern forming process and a shrink agent according to the invention, as defined below.

[1] A pattern forming process comprising the steps of:
applying a resist composition comprising a polymer comprising recurring units having an acid labile group-substituted carboxyl group, an acid generator and an organic solvent onto a substrate,
prebaking to form a resist film,
exposing the resist film to high-energy radiation,
baking the film,
developing the exposed resist film in an organic solvent-based developer to form a negative pattern,
applying a shrink agent onto the negative pattern, the shrink agent being a solution of a copolymer comprising recurring units having an α-trifluoromethylhydroxy and/or fluoroalkylsulfonamide group and recurring units having an acid labile group-substituted amino group in a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms,
baking, and
removing the excessive shrink agent for thereby shrinking the size of spaces in the pattern.

[2] The pattern forming process of [1] wherein the copolymer comprising recurring units having an α-trifluoromethylhydroxy and/or fluoroalkylsulfonamide group and recurring units having an acid labile group-substituted amino group has the general formula (1):

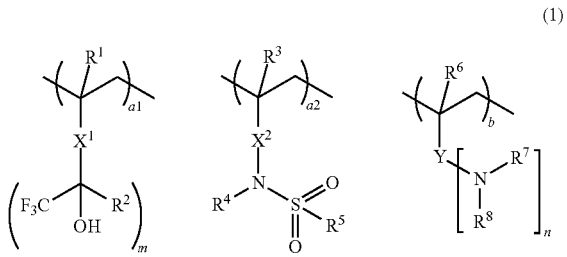

wherein $R^1$, $R^3$, and $R^6$ each are hydrogen or methyl, m is 1 or 2, $X^1$ in case that m is 1 and $X^2$ each are phenylene or —C(=O)—O—$R^9$—, $R^9$ is a straight, branched or cyclic $C_1$-$C_{10}$ alkylene group which may contain an ether or ester moiety, $C_6$-$C_{10}$ arylene group, or $C_2$-$C_{10}$ alkenylene group, or $X^1$ in case that m is 2 is a trivalent group in which one hydrogen atom is eliminated from $X^1$ in case that m is 1, $R^2$ is hydrogen, fluorine, methyl, trifluoromethyl, or difluoromethyl, $R^2$ may bond with $X^1$ to form a $C_1$-$C_6$ ring which may contain a fluorine atom or ether moiety, $R^4$ is hydrogen or a $C_1$-$C_4$ alkyl group, $R^5$ is a straight, branched or cyclic $C_1$-$C_{10}$ alkyl group or $C_6$-$C_{10}$ aryl group which has at least one fluorine atom, n is 1 or 2, Y in case that n is 1 is a single bond, —C(=O)—O—$R^{10}$— or —C(=O)—NH—, $R^{10}$ is a single bond, a straight, branched or cyclic $C_1$-$C_{10}$ alkylene group which may contain an ether moiety, ester moiety, —N= or —S—, or a phenylene group or naphthylene group, or Y in case that n is 2 is a trivalent group in which one hydrogen atom is eliminated from Y in case that n is 1, $R^7$ is an acid labile group, $R^8$ is hydrogen, $C_1$-$C_4$ alkyl group or acid labile group, $R^8$ may bond with Y to form a $C_3$-$C_{10}$ ring, $0 \leq a1 < 1.0$, $0 \leq a2 < 1.0$, $0 < a1+a2 < 1.0$, and $0 < b < 1.0$.

[3] The pattern forming process of [2] wherein the recurring units (a1) and/or (a2) and the recurring units (b) form a block copolymer.

[4] The pattern forming process of [1] wherein the solvent of the shrink agent is selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms, such that the patterned resist film after development may experience a thickness loss of up to 10 nm when the film is kept in contact with the solvent for 30 seconds.

[5] The pattern forming process of [1] wherein the solvent of the shrink agent is selected from the group consisting of di-n-butyl ether, diisobutyl ether, di-sec-butyl ether, di-n-pentyl ether, diisopentyl ether, di-sec-pentyl ether, di-tert-amyl ether, di-n-hexyl ether, methyl cyclopentyl ether, methyl cyclohexyl ether, methyl phenyl ether, methyl benzyl ether, ethyl cyclopentyl ether, ethyl cyclohexyl ether, ethyl phenyl ether, ethyl benzyl ether, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, benzene, toluene, xylene, mesitylene, ethylbezene, n-propylbenzene, cumene, n-butylbenzene, cymene, amylbenzene, diethylbenzene, octane, nonane, decane, turpentine oil, pinene, 2-octanone, 2-nonanone, 2-heptanone, 3-heptanone, 4-heptanone, 2-hexanone, 3-hexanone, diisobutyl ketone, methylcyclohexanone, acetophenone, methylacetophenone, ethyl n-butyl ketone, di-n-butyl ketone, diisobutyl ketone, amyl phoronate, amyl acetate, isoamyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, amyl valerate, isoamyl valerate, ethyl isovalerate, propyl isovalerate, isopropyl isovalerate, butyl isovalerate, isobutyl isovalerate, tert-butyl isovalerate, isoamyl isovalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, propyl butyrate, butyl butyrate, isobutyl butyrate, tert-butyl butyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, 2-phenylethyl acetate, and a mixture thereof.

[6] The pattern forming process of [1] wherein the removing step uses a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms.

[7] The pattern forming process of [1] wherein the polymer in the resist composition comprises recurring units having the general formula (2):

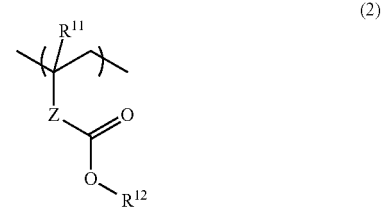

wherein $R^{11}$ is hydrogen or methyl, $R^{12}$ is an acid labile group, Z is a single bond or —C(=O)—O—$R^{13}$—, $R^{13}$ is a straight, branched or cyclic $C_1$-$C_{10}$ alkylene group which may contain an ether or ester moiety, or naphthylene group.

[8] The pattern forming process of [1] wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

[9] A shrink agent comprising a block copolymer and a solvent, wherein the block copolymer comprising recurring units having an α-trifluoromethylhydroxy and/or fluoroalkylsulfonamide group and recurring units having an acid labile group-substituted amino group has the general formula (1):

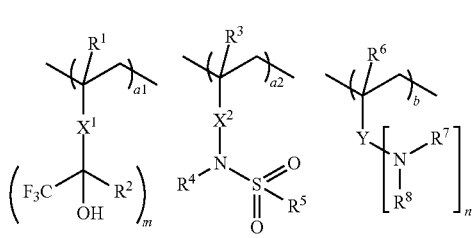

wherein $R^1$, $R^3$, and $R^6$ each are hydrogen or methyl, m is 1 or 2, $X^1$ in case that m is 1 and $X^2$ each are phenylene or —C(=O)—O—$R^9$—, $R^9$ is a straight, branched or cyclic $C_1$-$C_{10}$ alkylene group which may contain an ether or ester moiety, $C_6$-$C_{10}$ arylene group, or $C_2$-$C_{10}$ alkenylene group, or $X^1$ in case that m is 2 is a trivalent group in which one hydrogen atom is eliminated from $X^1$ in case that m is 1, $R^2$ is hydrogen, fluorine, methyl, trifluoromethyl, or difluoromethyl, $R^2$ may bond with $X^1$ to form a $C_1$-$C_6$ ring which may contain a fluorine atom or ether moiety, $R^4$ is hydrogen or a $C_1$-$C_4$ alkyl group, $R^5$ is a straight, branched or cyclic $C_1$-$C_{10}$ alkyl group or $C_6$-$C_{10}$ aryl group which has at least one fluorine atom, n is 1 or 2, Y in case that n is 1 is a single bond, —C(=O)—O—$R^{10}$— or —C(=O)—NH—, $R^{10}$ is a single bond, a straight, branched or cyclic $C_1$-$C_{10}$ alkylene group which may contain an ether moiety, ester moiety, —N= or —S—, or a phenylene group or naphthylene group, or Y in case that n is 2 is a trivalent group in which one hydrogen atom is eliminated from Y in case that n is 1, $R^7$ is an acid labile group, $R^8$ is hydrogen, $C_1$-$C_4$ alkyl group or acid labile group, $R^8$ may bond with Y to form a $C_3$-$C_{10}$ ring, $0 \le a1 < 1.0$, $0 \le a2 < 1.0$, $0 < a1+a2 < 1.0$, and $0 < b < 1.0$, and wherein the solvent is selected from the group consisting of di-n-butyl ether, diisobutyl ether, di-sec-butyl ether, di-n-pentyl ether, diisopentyl ether, di-sec-pentyl ether, di-tert-amyl ether, di-n-hexyl ether, methyl cyclopentyl ether, methyl cyclohexyl ether, methyl phenyl ether, methyl benzyl ether, ethyl cyclopentyl ether, ethyl cyclohexyl ether, ethyl phenyl ether, ethyl benzyl ether, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, benzene, toluene, xylene, mesitylene, ethylbenzene, n-propylbenzene, cumene, n-butylbenzene, cymene, amylbenzene, diethylbenzene, octane, nonane, decane, turpentine oil, pinene, 2-octanone, 2-nonanone, 2-heptanone, 3-heptanone, 4-heptanone, 2-hexanone, 3-hexanone, diisobutyl ketone, methylcyclohexanone, acetophenone, methylacetophenone, ethyl n-butyl ketone, di-n-butyl ketone, diisobutyl ketone, amyl phoronate, amyl acetate, isoamyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, amyl valerate, isoamyl valerate, ethyl isovalerate, propyl isovalerate, isopropyl isovalerate, butyl isovalerate, isobutyl isovalerate, tert-butyl isovalerate, isoamyl isovalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, propyl butyrate, butyl butyrate, isobutyl butyrate, tert-butyl butyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, 2-phenylethyl acetate, and a mixture thereof.

Advantageous Effects of Invention

According to the invention, by coating a resist pattern as developed with a shrink agent which is a solution of a copolymer comprising recurring units having an α-trifluoromethylhydroxy and/or fluoroalkylsulfonamide group and recurring units having an acid labile group-substituted amino group in a solvent selected from among ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms, baking, and removing the excessive shrink agent, the size of spaces in the resist pattern can be shrunk in a precisely size-controlled manner.

BRIEF DESCRIPTION OF DRAWINGS

FIG. 1 illustrates, in cross-sectional view, early steps of a pattern forming or shrinking process according to the invention; FIG. 1 (A) showing a photoresist film formed on a substrate; FIG. 1 (B) showing the photoresist film during exposure; and FIG. 1 (C) showing pattern formation after PEB and development of the photoresist film.

FIG. 2 (D) showing a shrink agent coated on the resist pattern; FIG. 2 (E) showing the resist pattern whose spaces have been shrunk by baking and removal of the excessive shrink agent; and FIG. 2 (F) showing dry etching of the substrate through the shrunk space pattern as a mask.

DESCRIPTION OF PREFERRED EMBODIMENTS

Figure 2D:
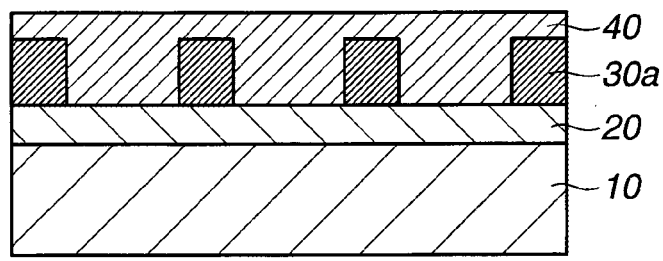
FIG. 2 illustrates, in cross-sectional view, later steps of the pattern forming or shrinking process according to the invention.

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. As used herein, the term "film" is used interchangeably with "coating" or "layer."

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator
CDU: critical dimension uniformity
LER: line edge roughness Searching for a shrink material capable of effectively shrinking a resist pattern as developed and a shrink process using the same, the inventors have found that the size of spaces in a resist pattern as developed can be shrunk in a precisely size-controlled manner by dissolving a copolymer comprising recurring units having an α-trifluoromethylhydroxy and/or fluoroalkylsulfonamide group and recurring units having an acid labile group-substituted amino group in an ether solvent of 6 to 12 carbon atoms, alcohol solvent of 4 to 10 carbon atoms, hydrocarbon solvent of 6 to 12 carbon atoms, ester solvent of 6 to 16 carbon atoms or ketone solvent of 7 to 16 carbon atoms to form a solution serving as shrink agent, applying the shrink agent onto the resist pattern as developed, baking, and removing the excessive shrink agent with an ether solvent of 6 to 12 carbon atoms, alcohol solvent of 4 to 10 carbon atoms, hydrocarbon solvent of 6 to 12 carbon atoms, ester solvent of 6 to 16 carbon atoms or ketone solvent of 7 to 16 carbon atoms.

The shrink agent used in the pattern forming process of the invention is a solution of a copolymer in a solvent. The shrink agent is based on a copolymer comprising recurring units having an α-trifluoromethylhydroxy and/or fluoroalkylsulfonamide group and recurring units having an acid labile group-substituted amino group, preferably having the general formula (1).

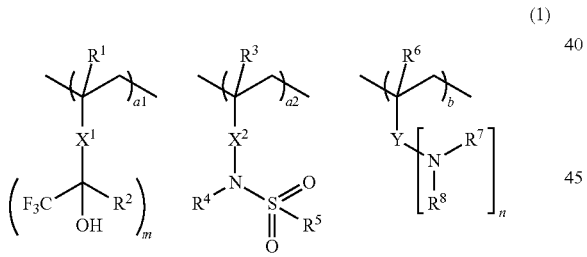

(1)

Herein $R^1$, $R^3$, and $R^6$ each are hydrogen or methyl. The subscript m is 1 or 2. $X^1$ in case that m is 1 and $X^2$ each are phenylene or —C(=O)—O—$R^9$—, wherein $R^9$ is a straight, branched or cyclic $C_1$-$C_{10}$ alkylene group which may contain an ether or ester moiety, $C_6$-$C_{10}$ arylene group, or $C_2$-$C_{10}$ alkenylene group. Or $X^1$ in case that m is 2 is a trivalent group in which one hydrogen atom is eliminated from $X^1$ in case that m is 1. $R^2$ is hydrogen, fluorine, methyl, trifluoromethyl, or difluoromethyl, $R^2$ may bond with $X^1$ to form a $C_1$-$C_6$ ring which may contain a fluorine atom or ether moiety. $R^4$ is hydrogen or a $C_1$-$C_4$ alkyl group. $R^5$ is a straight, branched or cyclic $C_1$-$C_{10}$ alkyl group or $C_6$-$C_{10}$ aryl group which has at least one fluorine atom. The subscript n is 1 or 2. Y in case that n is 1 is a single bond, —C(=O)—O—$R^{10}$— or —C(=O)—NH—, wherein $R^{10}$ is a single bond, a straight, branched or cyclic $C_1$-$C_{10}$ alkylene group which may contain an ether moiety, ester moiety, —N= or —S—, or a phenylene group or naphthylene group. Or Y in case that n is 2 is a trivalent group in which one hydrogen atom is eliminated from Y in case that n is 1. $R^2$ is an acid labile group. $R^8$ is hydrogen, $C_1$-$C_4$ alkyl group or acid labile group, $R^8$ may bond with Y to form a $C_3$-$C_{10}$ ring. The subscripts a1, a2 and b are numbers in the range: 0≤a1<1.0, 0≤a2<1.0, 0<a1+a2<1.0, and 0<b<1.0.

It should be avoided that when the shrink agent solution is applied onto a resist pattern, the resist pattern is dissolved in the solvent of the shrink agent. To this end, the solvent of the shrink agent must be selected from those solvents that do not dissolve the resist film. The solvents that do not dissolve the resist film include ether solvents of 6 to 12 carbon atoms, alcohol solvents of 4 to 10 carbon atoms, hydrocarbon solvents of 6 to 12 carbon atoms, ester solvents of 6 to 16 carbon atoms, ketone solvents of 7 to 16 carbon atoms, and water. Although a number of water-based shrink agents are already proposed as alluded to previously, they are difficult to quickly apply to large-diameter wafers because of the high surface tension of water. A problem arises particularly in the case of a fine hole pattern formed via negative development. When holes are filled with the shrink agent by spin coating, the water solvent having a high surface tension prevents the shrink agent from burying in the holes to the bottom. In contrast, when a shrink agent dissolved in an organic solvent having a lower surface tension than water is applied, the ability to fill or bury to the hole bottom is improved. To increase the solubility of a copolymer in the above-listed organic solvents, fluoroalcohol-bearing units (a1) and fluorosulfonamide-bearing units (a2) are essential for the copolymer.

The recurring units (a1) and (a2) as represented in formula (1) are derived from those monomers having the general formulae Ma1 and Ma2, respectively. Herein $R^1$ to $R^5$, $X^1$, $X^2$, and m are as defined above.

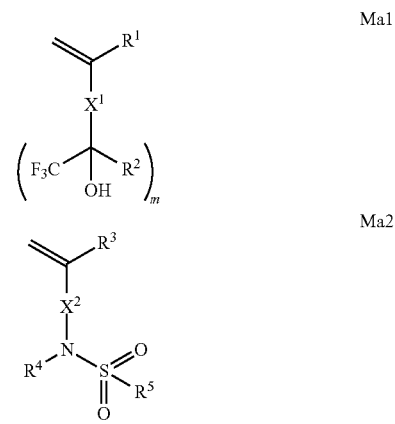

Examples of the monomer Ma1 are shown below.

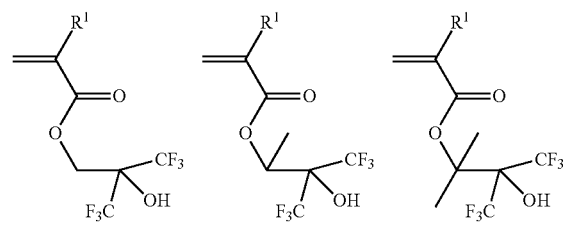

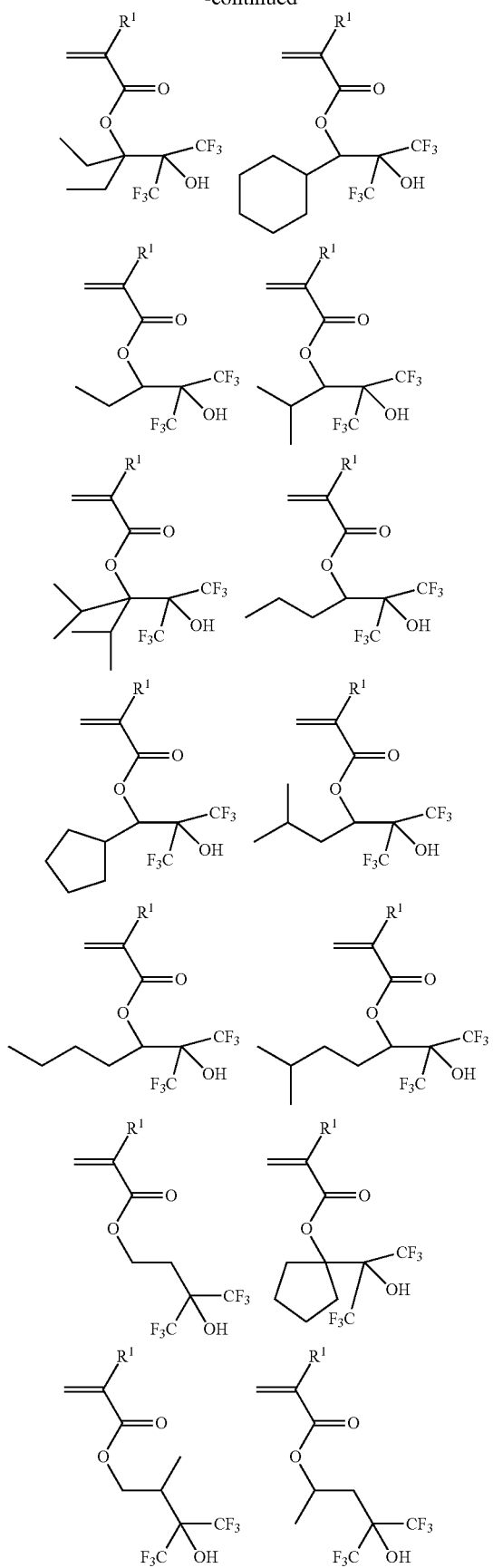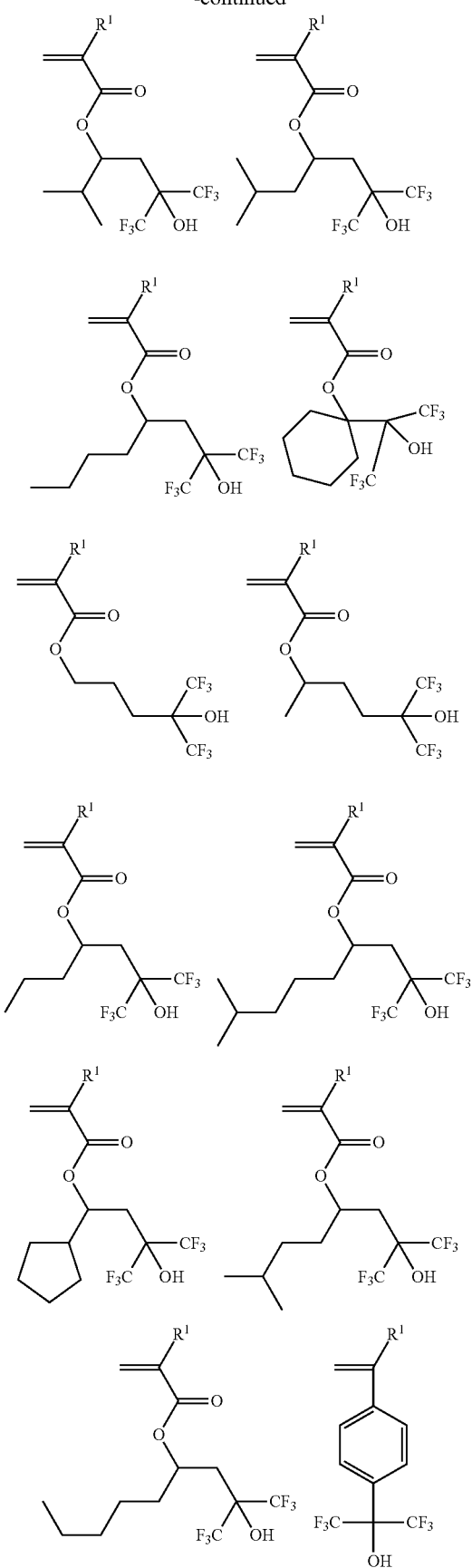

-continued
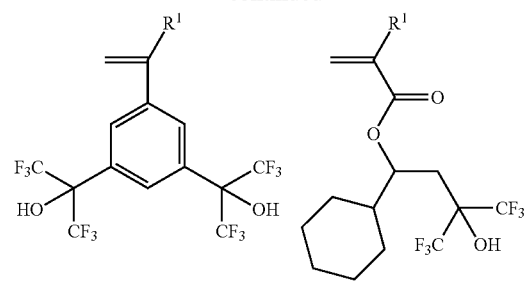
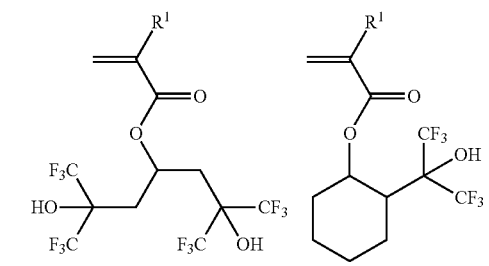
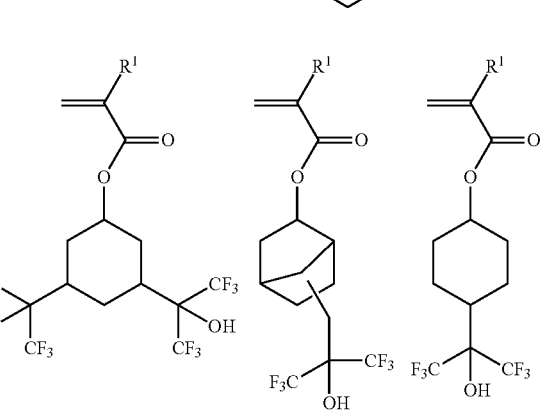
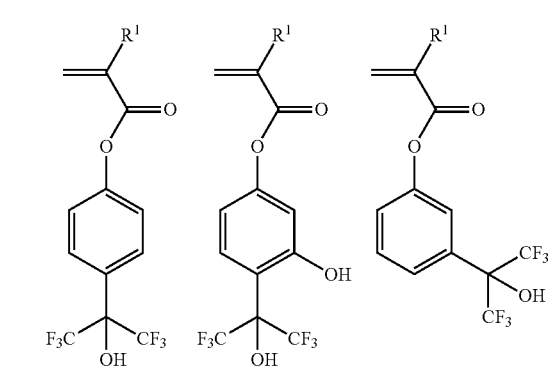
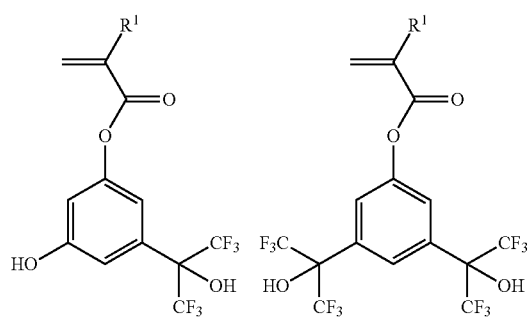
-continued
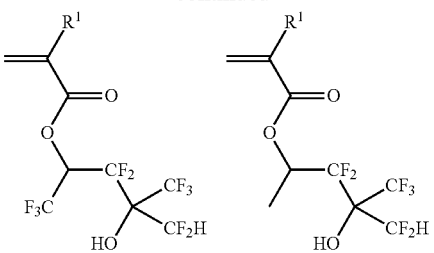
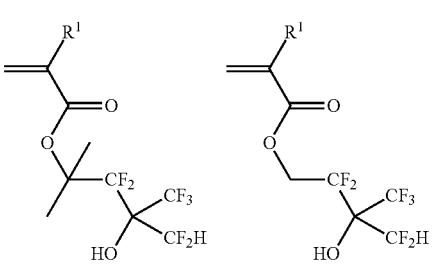
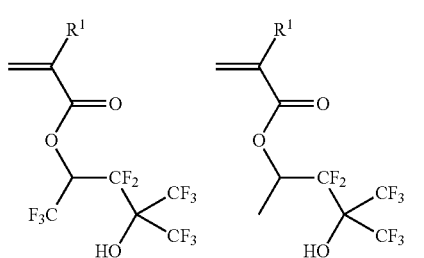
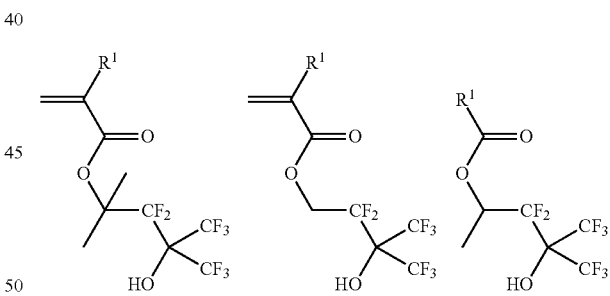
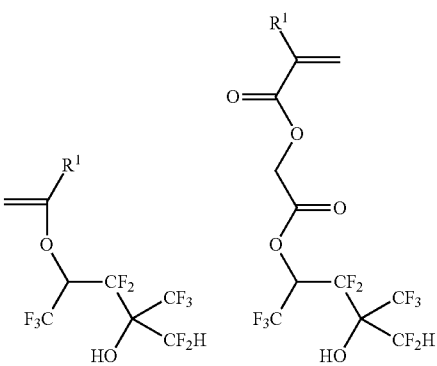

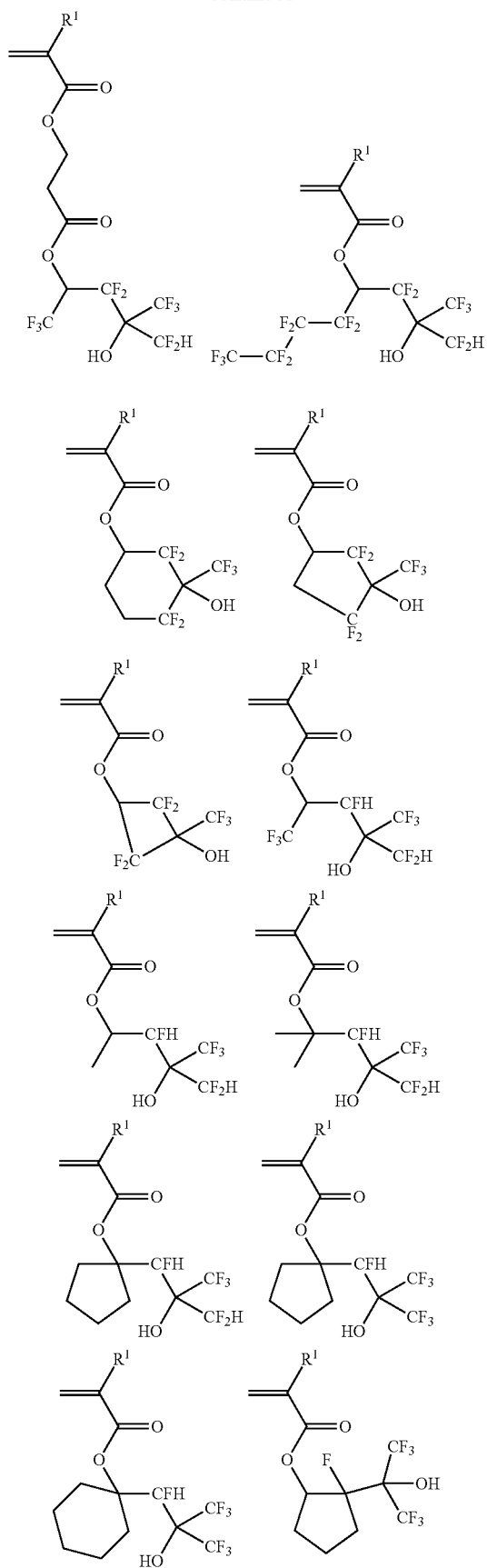
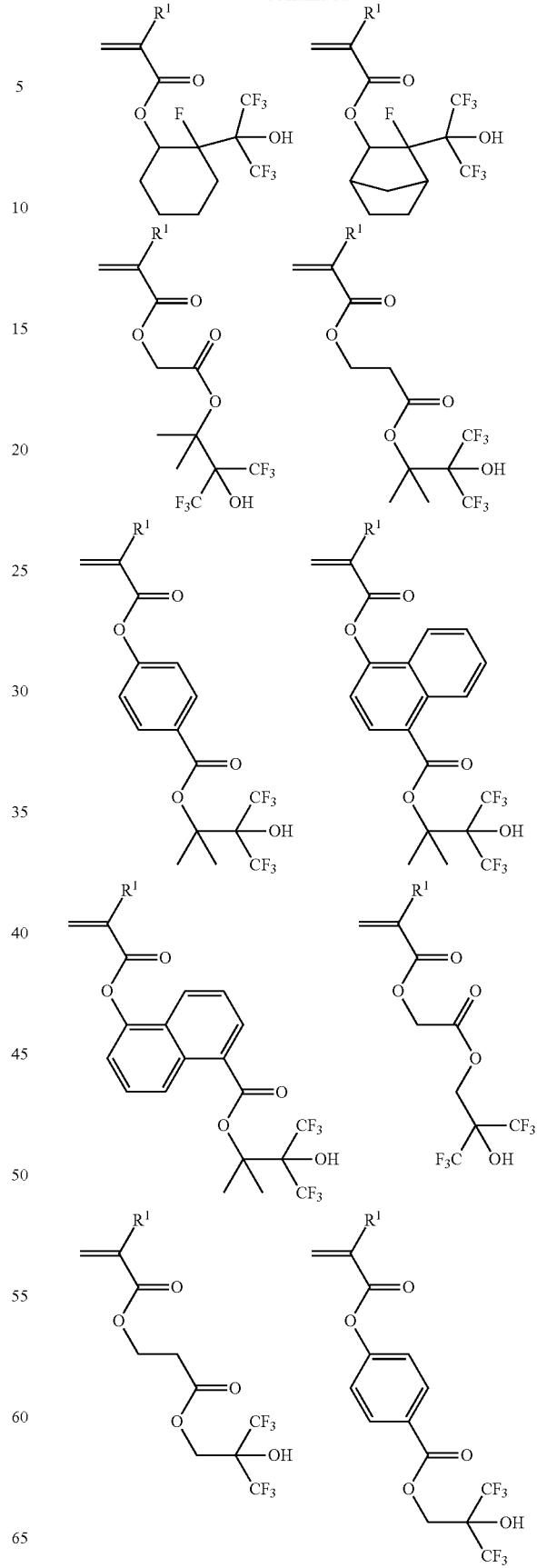

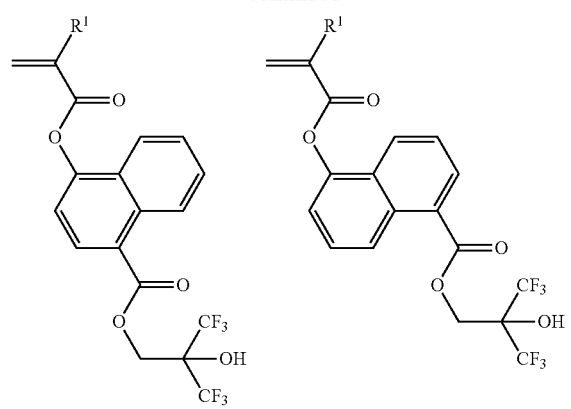
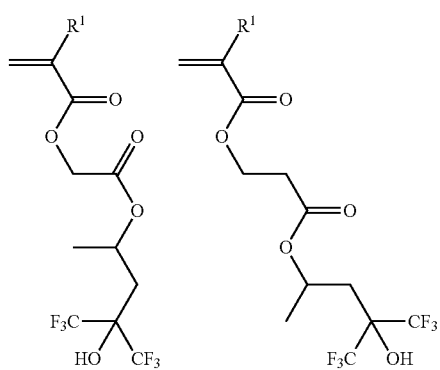
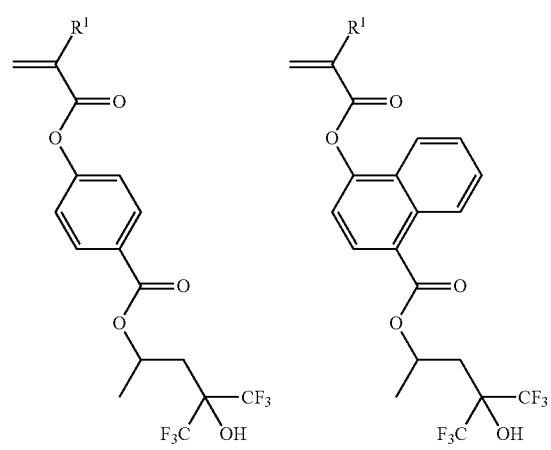
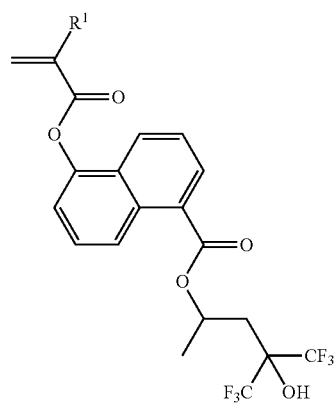
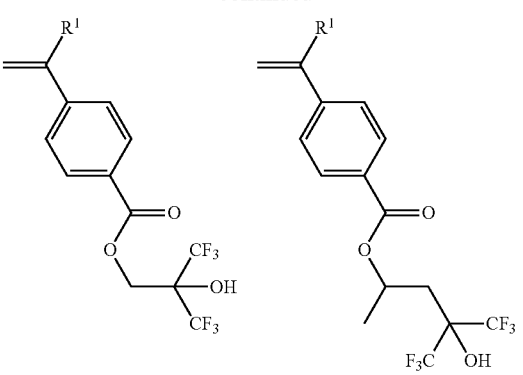
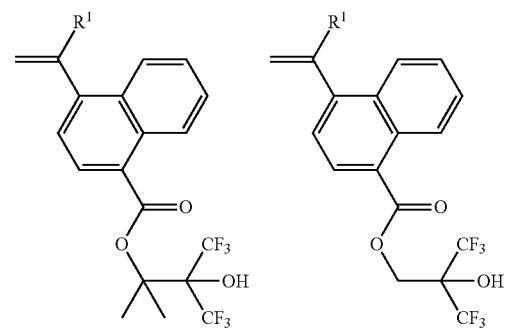
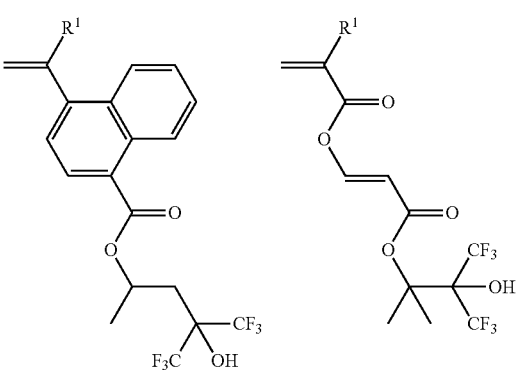
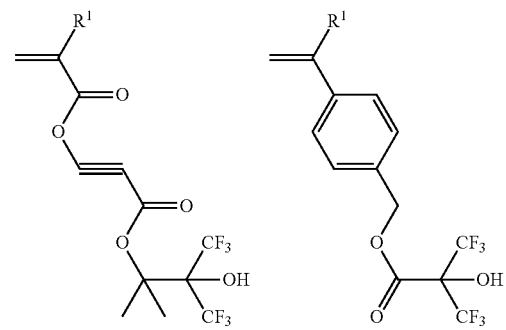
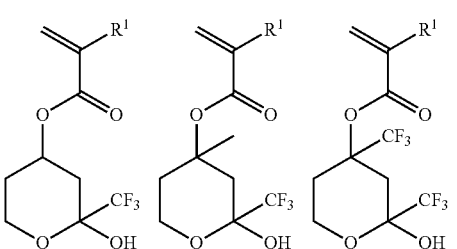

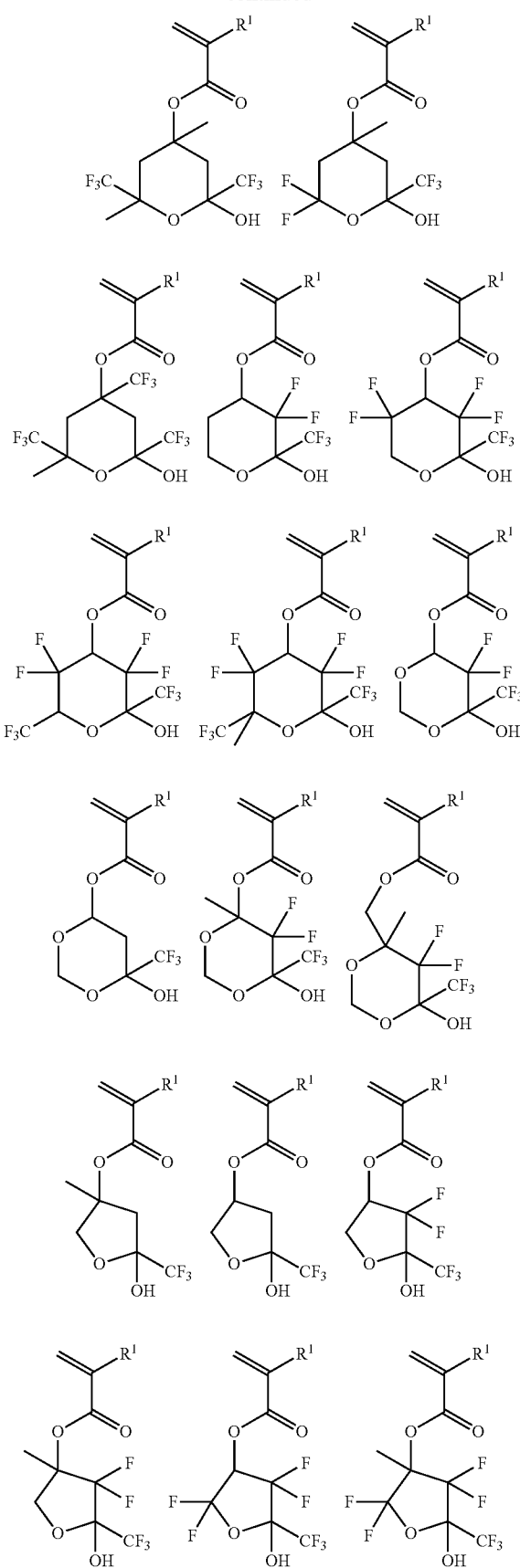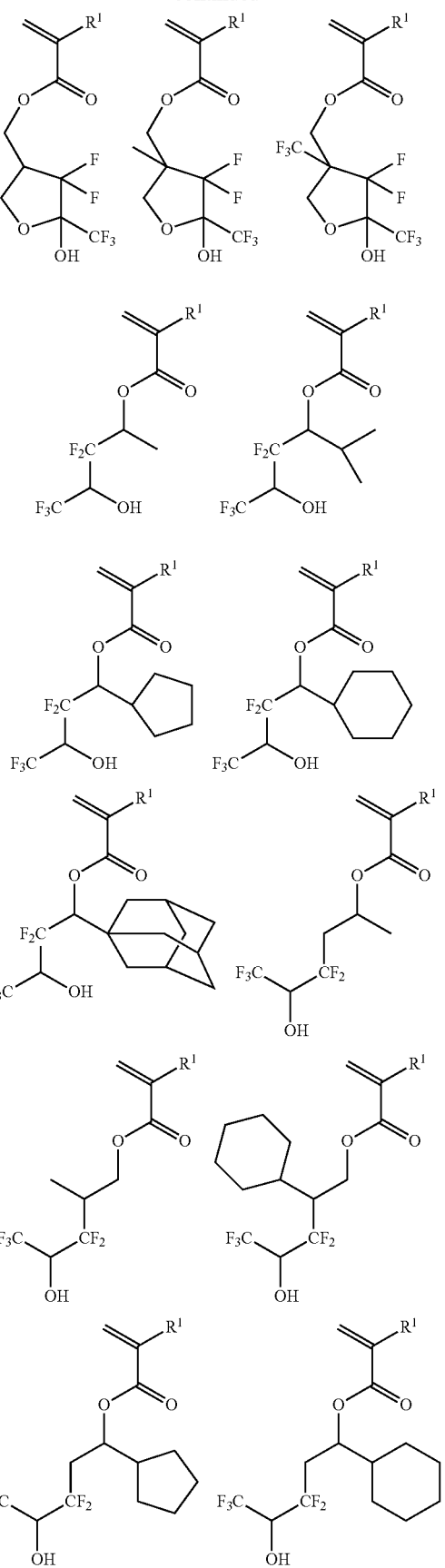

-continued

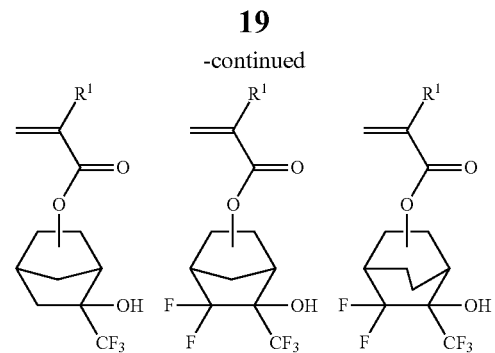

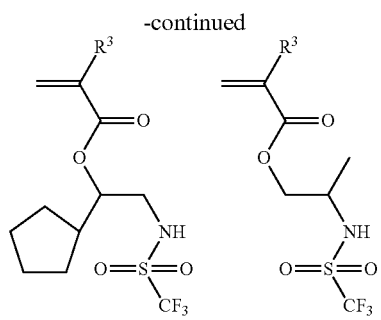

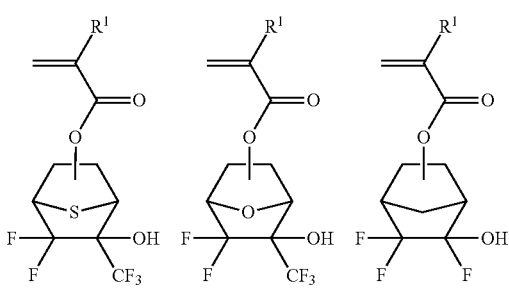

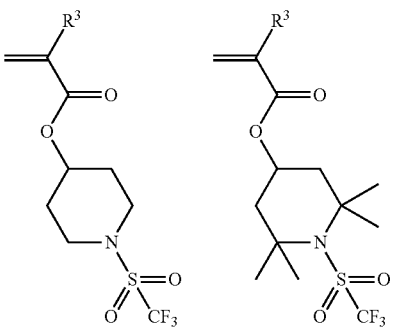

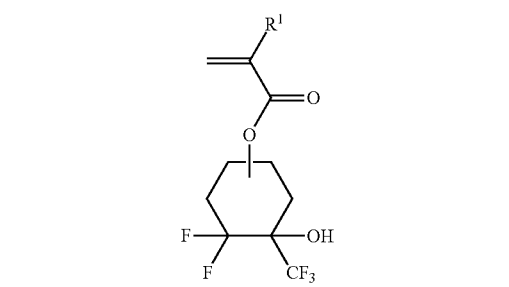

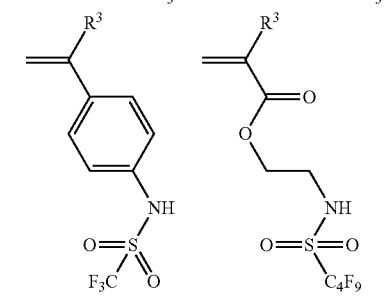

Examples of the monomer Ma2 are shown below.

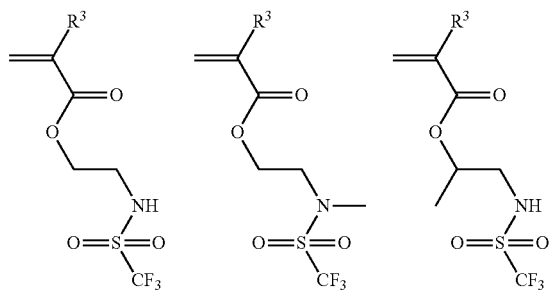

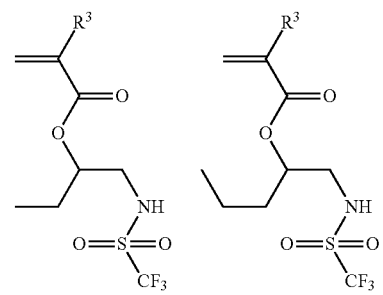

Carboxyl groups and an acid catalyst are present on the surface of a patterned resist film onto which the shrink agent is applied. A water-soluble shrink agent having an amino group bonds to the resist film surface via neutralization reaction, achieving shrinkage. If recurring units (a1) and (a2), which are acidic units, are copolymerized with recurring units having an amino group, they form a salt, becoming a gel which does not dissolve in the organic solvent. Thus, the invention proposes to copolymerize recurring units (b) of protected amine devoid of basicity with recurring units (a1) and (a2) and to use the resulting copolymer as shrink agent. It never happens that units (a1) and (a2) and units (b) form a salt to become a gel.

The recurring units (b) as represented in formula (1) are derived from the monomer having the general formula Mb. Herein $R^6$ to $R^8$, Y, and n are as defined above.

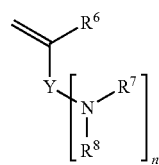

Mb

Examples of the monomer Mb are shown below.
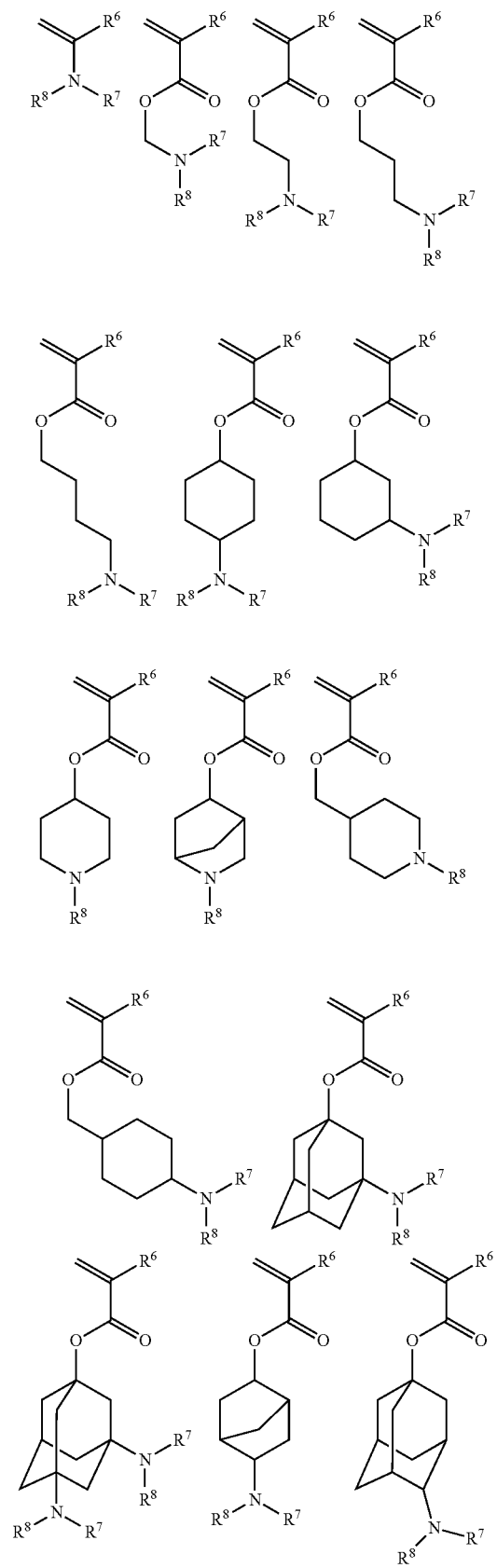
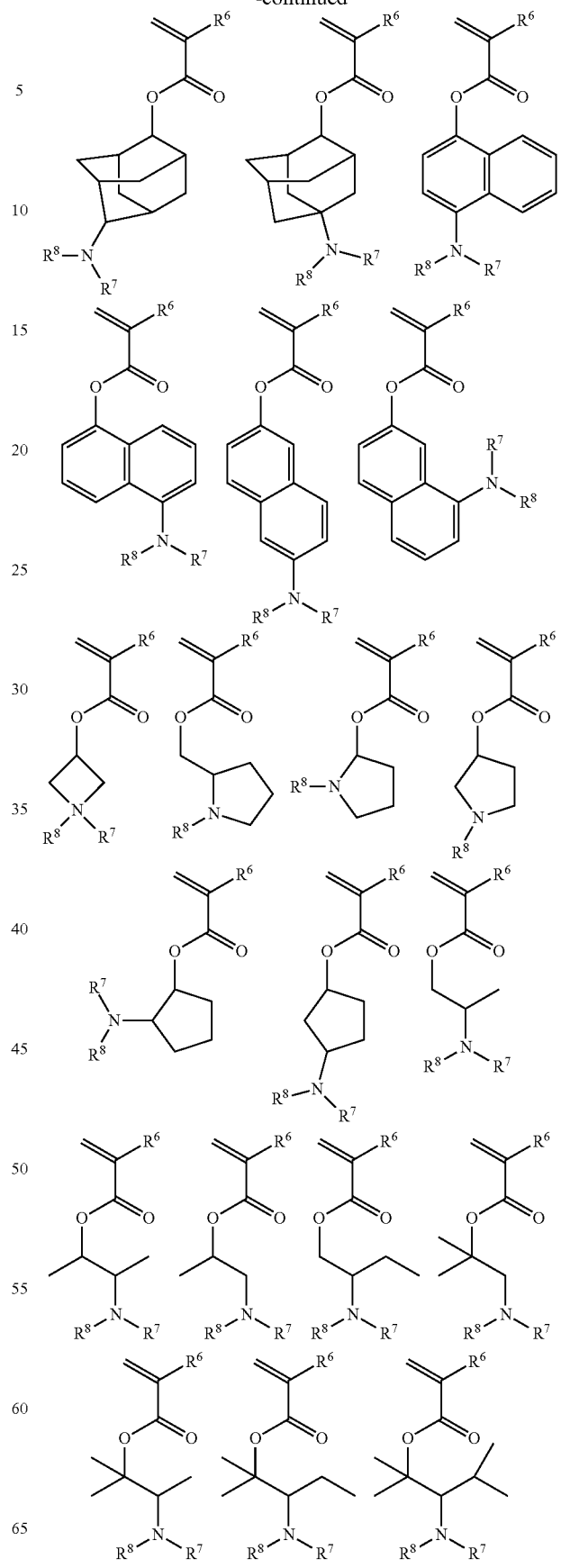
-continued

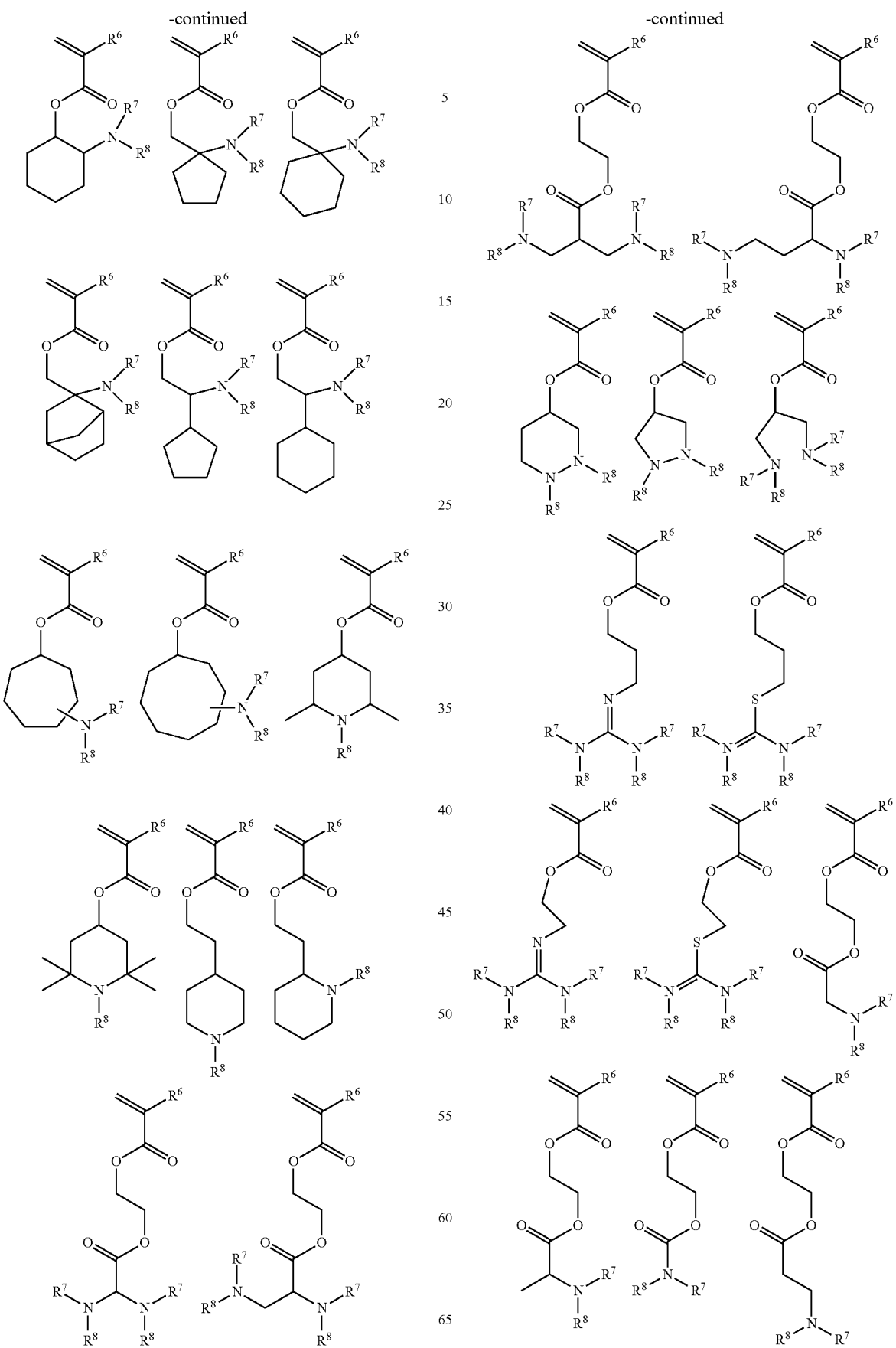

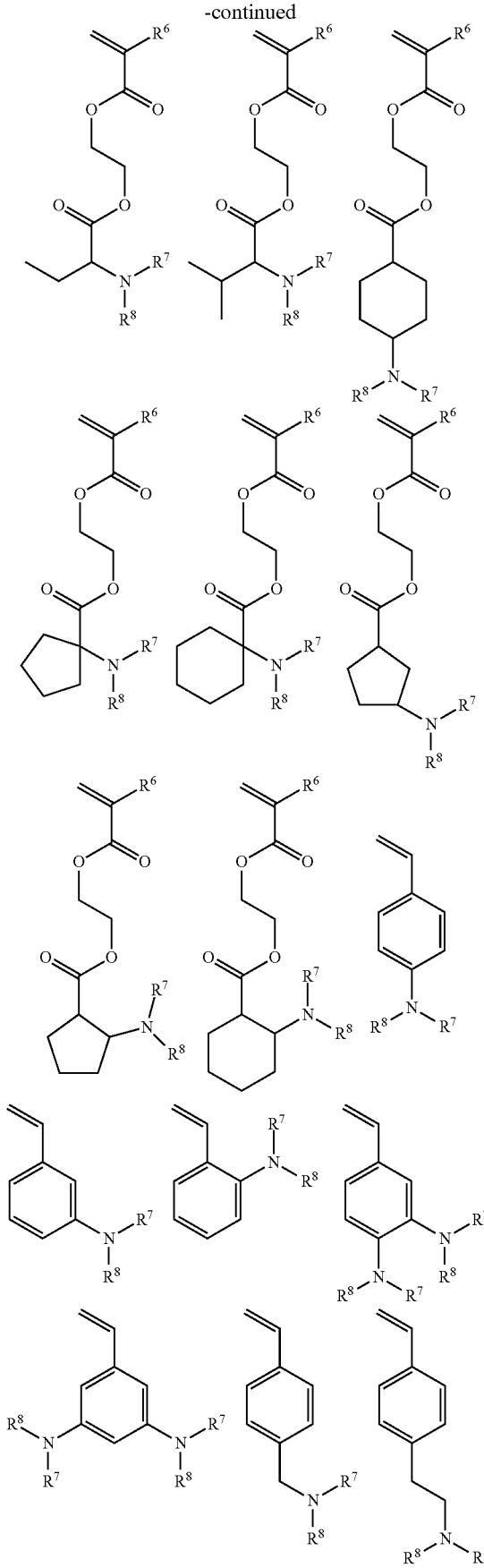
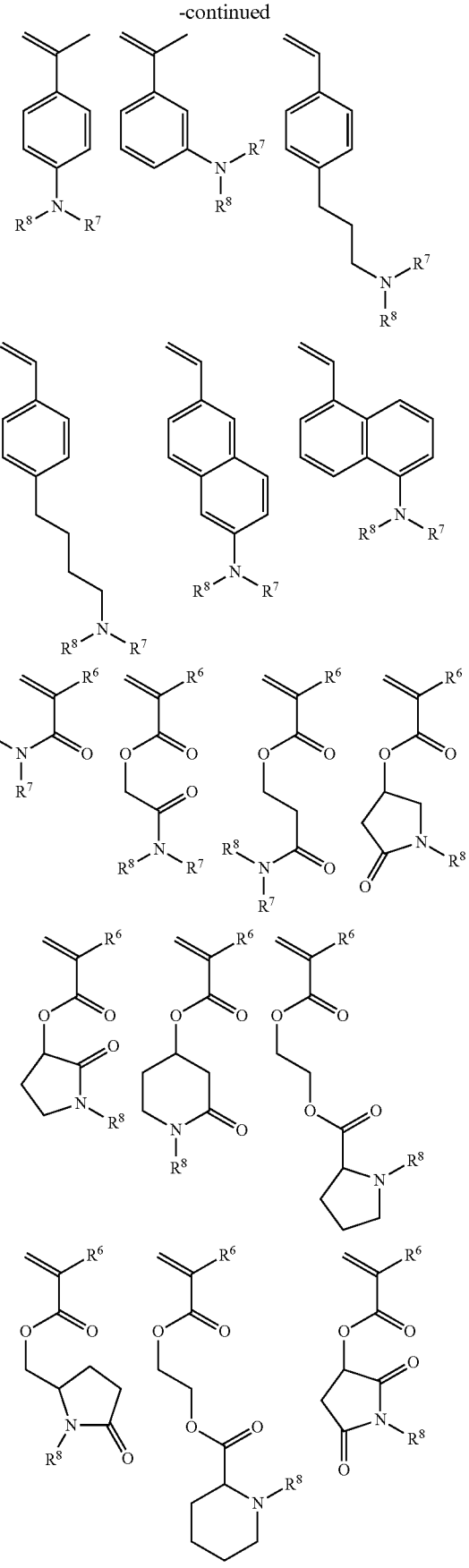

-continued

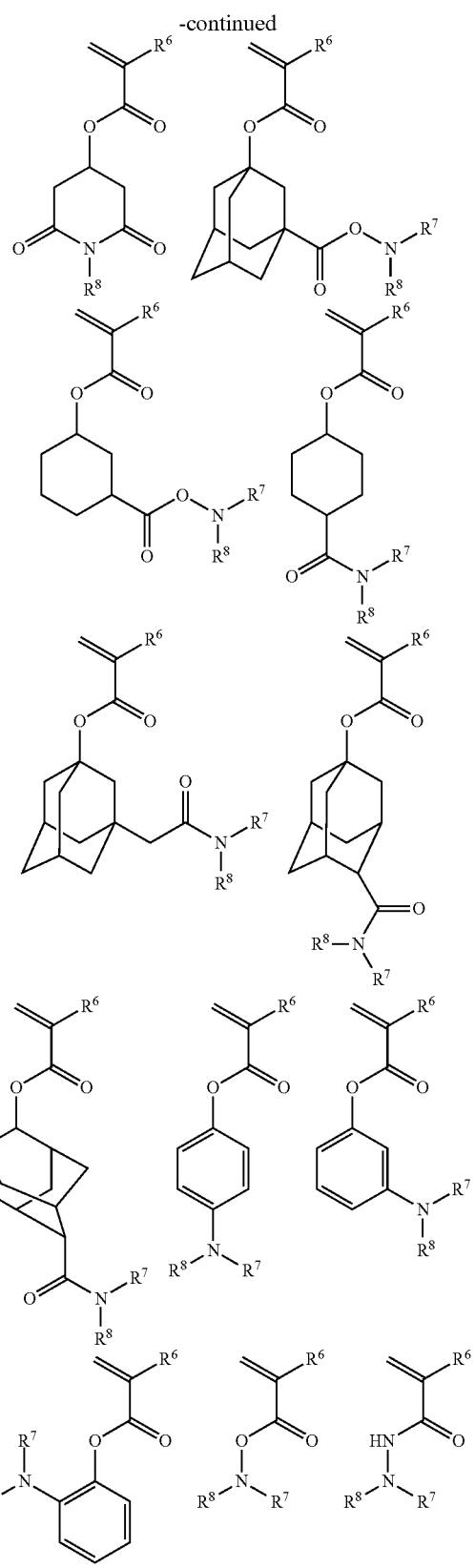

The acid labile groups represented by $R^7$ and $R^8$ in formula (1) and $R^{12}$ in formula (2) to be described below may be selected from a variety of such groups. Preferred acid labile groups are groups of formulae (AL-10) and (AL-11), tertiary alkyl groups of formula (AL-12), and oxoalkyl groups of 4 to 20 carbon atoms, but not limited thereto.

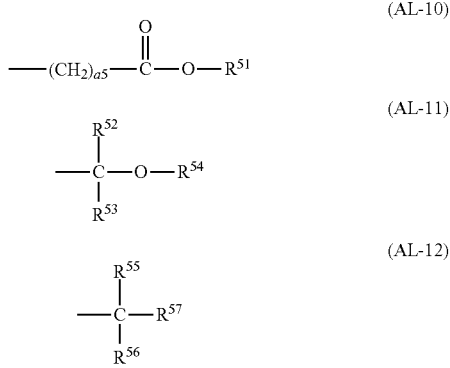

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, preferably 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

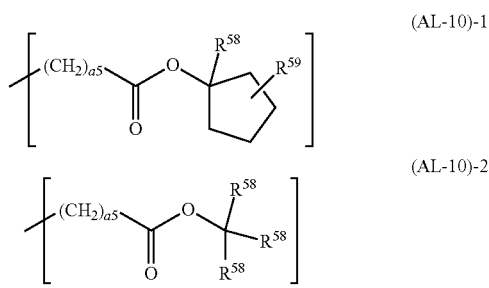

-continued

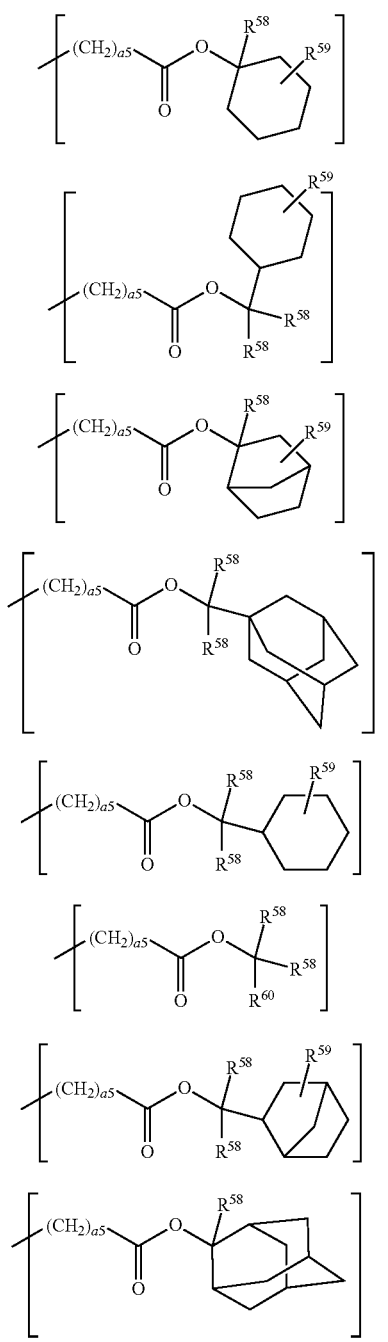

(AL-10)-3
(AL-10)-4
(AL-10)-5
(AL-10)-6
(AL-10)-7
(AL-10)-8
(AL-10)-9
(AL-10)-10

In formulae (AL-10)-1 to (AL-10)-10, $R^{58}$ is independently a straight, branched or cyclic $C_1$-$C_8$ alkyl group, $C_6$-$C_{60}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-112.

—CH$_2$—O—CH$_3$ (AL-11)-1

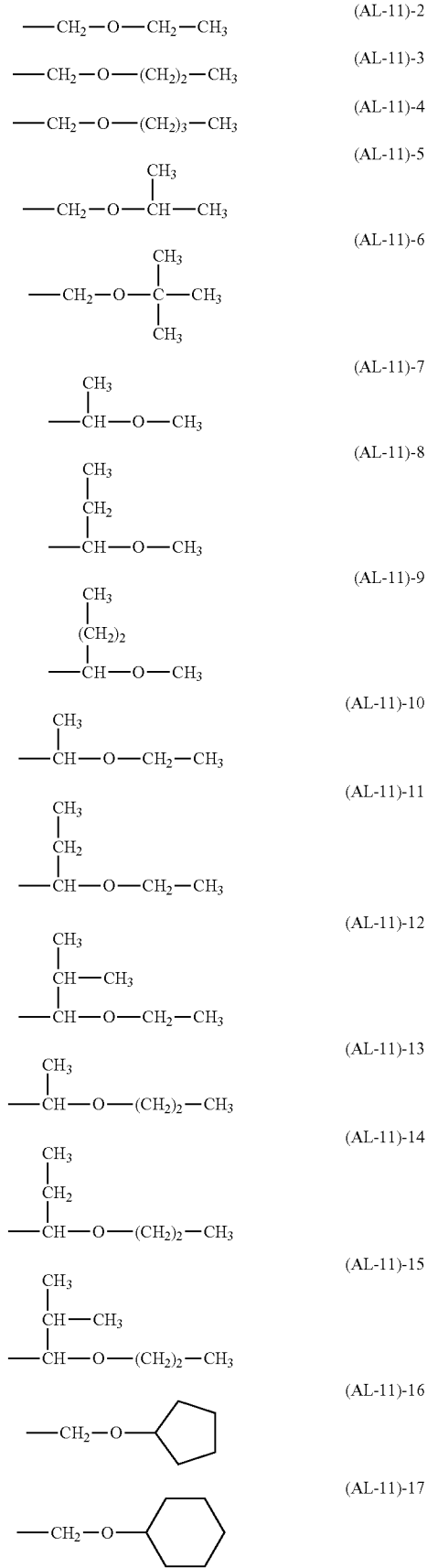

(AL-11)-2
—CH$_2$—O—CH$_2$—CH$_3$ (AL-11)-3
—CH$_2$—O—(CH$_2$)$_2$—CH$_3$ (AL-11)-4
—CH$_2$—O—(CH$_2$)$_3$—CH$_3$ (AL-11)-5
(AL-11)-6
(AL-11)-7
(AL-11)-8
(AL-11)-9
(AL-11)-10
(AL-11)-11
(AL-11)-12
(AL-11)-13
(AL-11)-14
(AL-11)-15
(AL-11)-16
(AL-11)-17

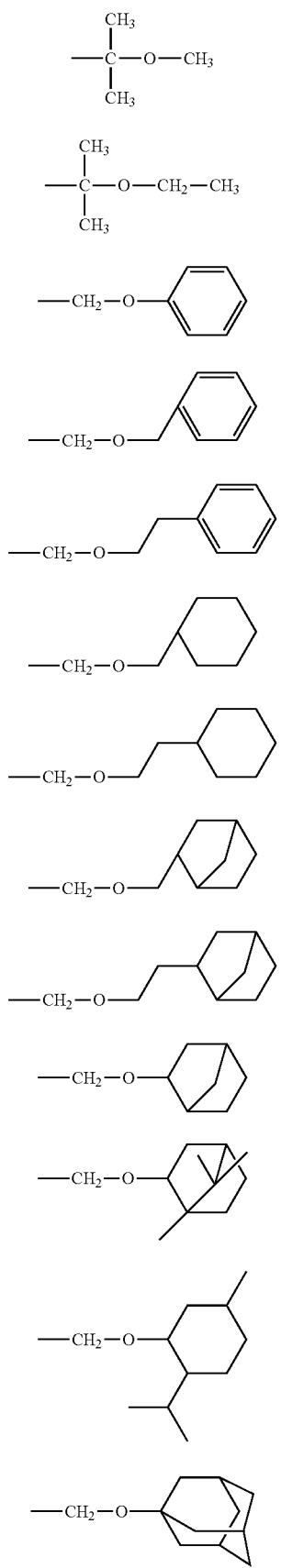
(AL-11)-18
(AL-11)-19
(AL-11)-20
(AL-11)-21
(AL-11)-22
(AL-11)-23
(AL-11)-24
(AL-11)-25
(AL-11)-26
(AL-11)-27
(AL-11)-28
(AL-11)-29
(AL-11)-30
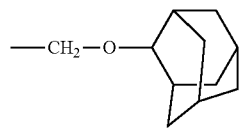
(AL-11)-31
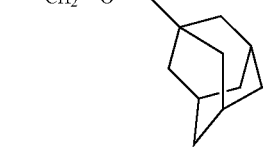
(AL-11)-32
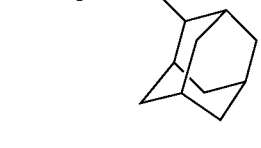
(AL-11)-33
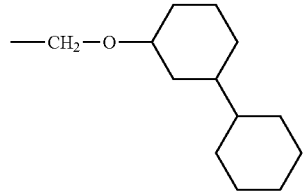
(AL-11)-34
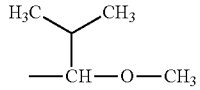
(AL-11)-35
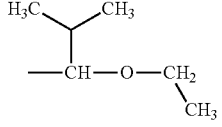
(AL-11)-36
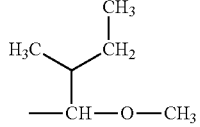
(AL-11)-37
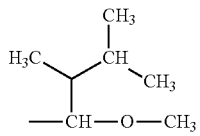
(AL-11)-38
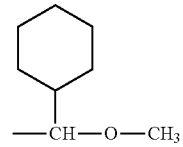
(AL-11)-39
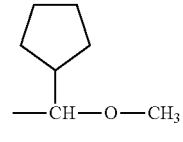
(AL-11)-40

-continued
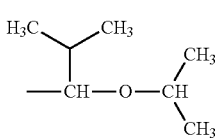 (AL-11)-41
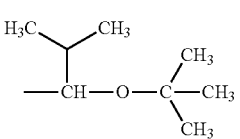 (AL-11)-42
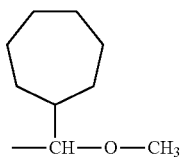 (AL-11)-43
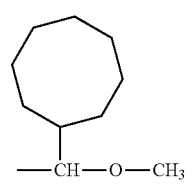 (AL-11)-44
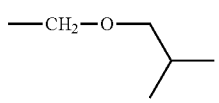 (AL-11)-45
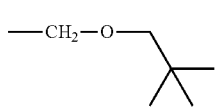 (AL-11)-46
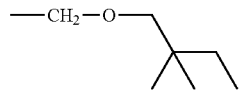 (AL-11)-47
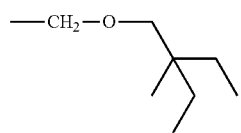 (AL-11)-48
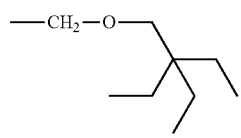 (AL-11)-49
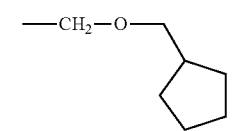 (AL-11)-50
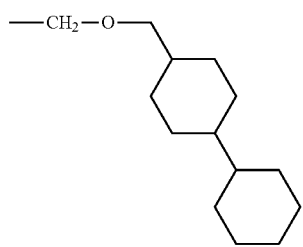 (AL-11)-51
-continued
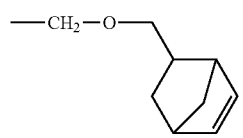 (AL-11)-52
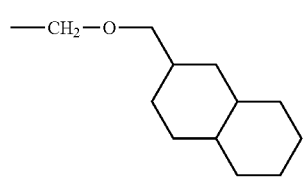 (AL-11)-53
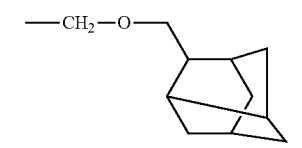 (AL-11)-54
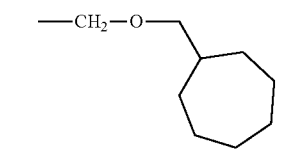 (AL-11)-55
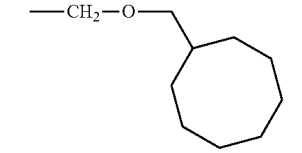 (AL-11)-56
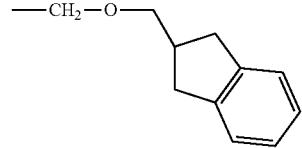 (AL-11)-57
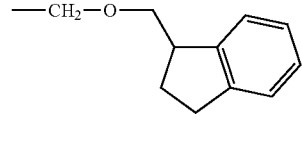 (AL-11)-58
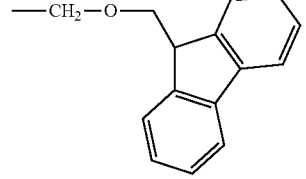 (AL-11)-59
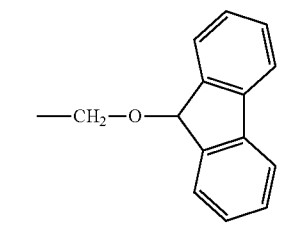 (AL-11)-60

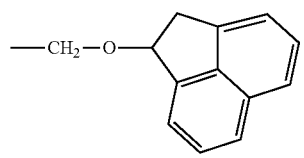 (AL-11)-61
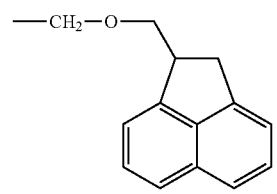 (AL-11)-62
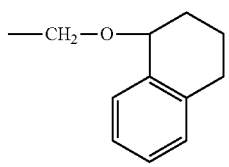 (AL-11)-63
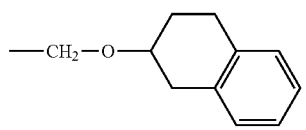 (AL-11)-64
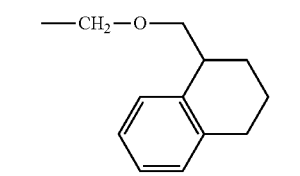 (AL-11)-65
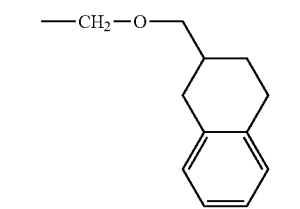 (AL-11)-66
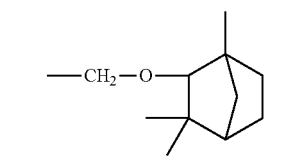 (AL-11)-67
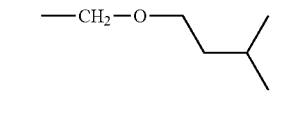 (AL-11)-68
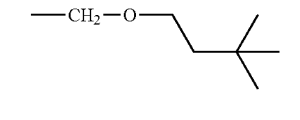 (AL-11)-69
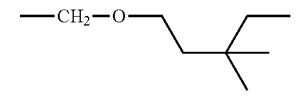 (AL-11)-70
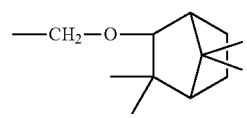 (AL-11)-71
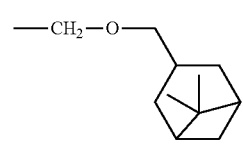 (AL-11)-72
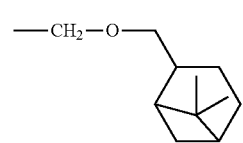 (AL-11)-73
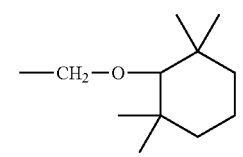 (AL-11)-74
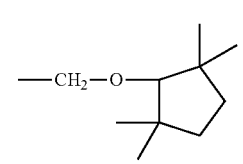 (AL-11)-75
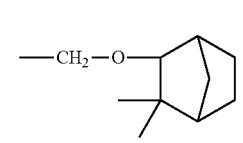 (AL-11)-76
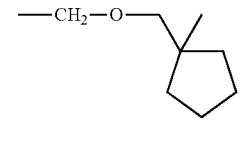 (AL-11)-77
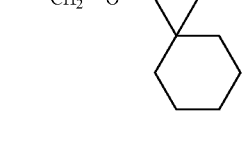 (AL-11)-78
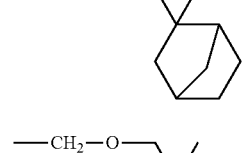 (AL-11)-79
 (AL-11)-80
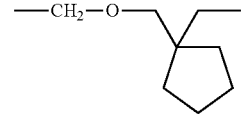 (AL-11)-81

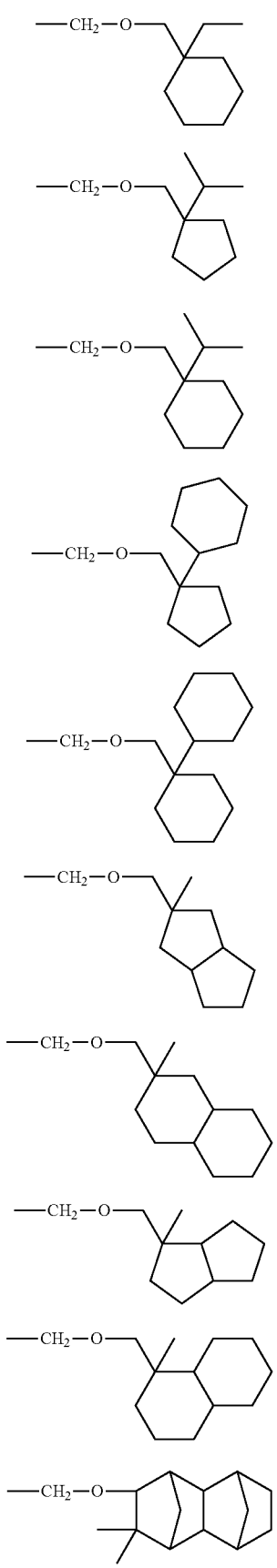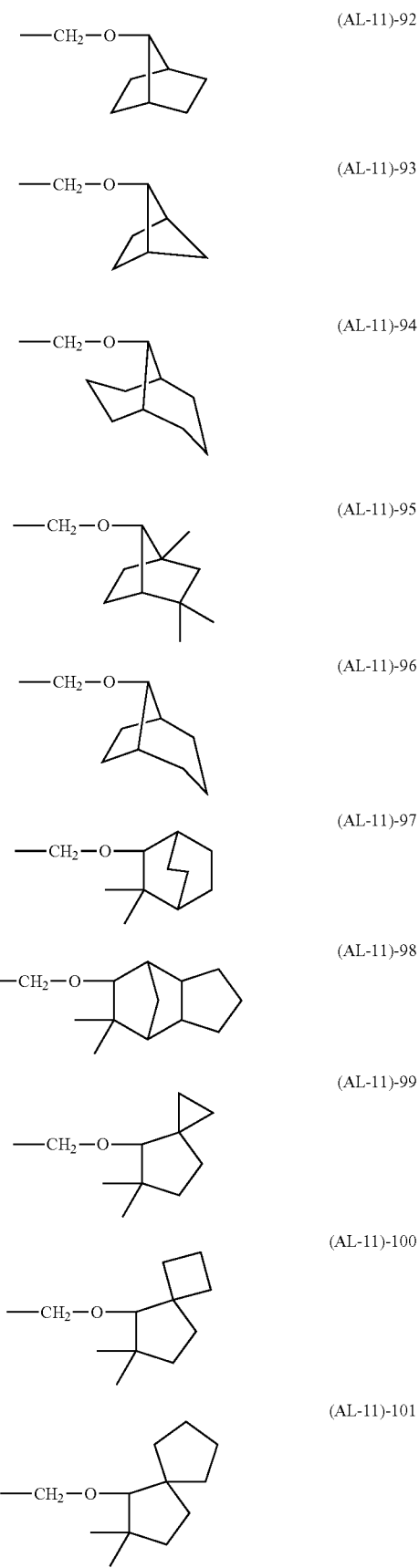

(AL-11)-102 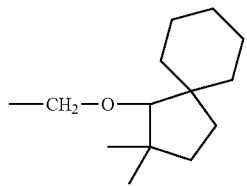

(AL-11)-103 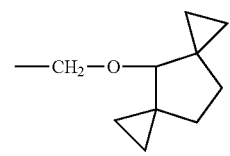

(AL-11)-104 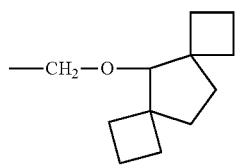

(AL-11)-105 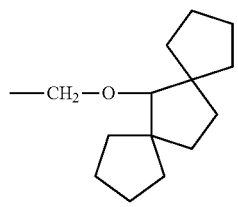

(AL-11)-106 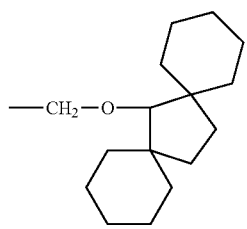

(AL-11)-107 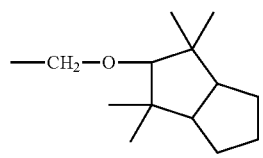

(AL-11)-108 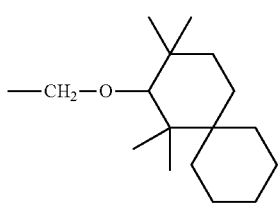

(AL-11)-109 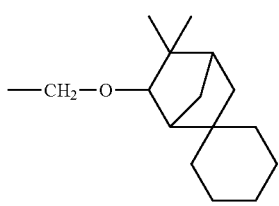

(AL-11)-110 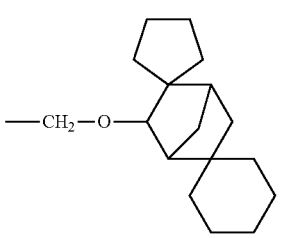

(AL-11)-111 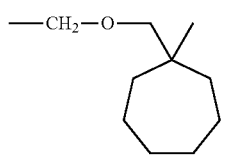

(AL-11)-112 

The polymer may be crosslinked within the molecule or between molecules with acid labile groups of formula (AL-11a) or (AL-11b).

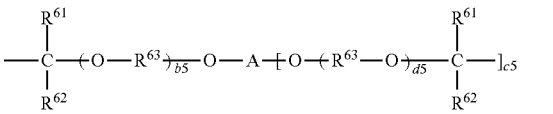

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl radicals or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.
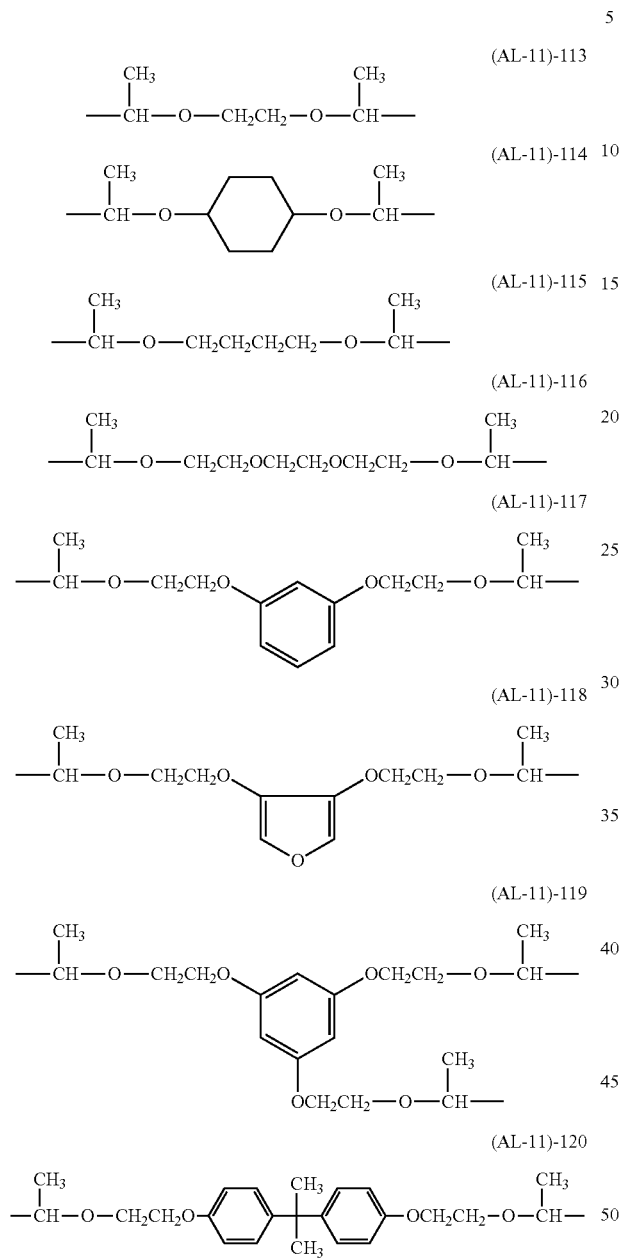
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
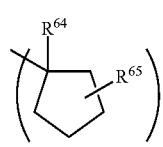
(AL-12)-1
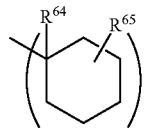
(AL-12)-2
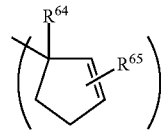
(AL-12)-3
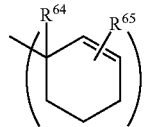
(AL-12)-4
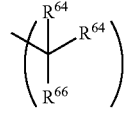
(AL-12)-5
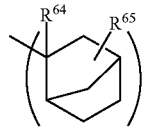
(AL-12)-6
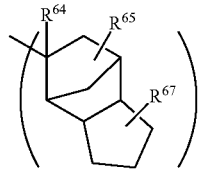
(AL-12)-7
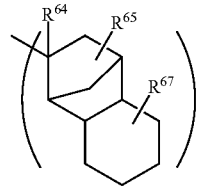
(AL-12)-8
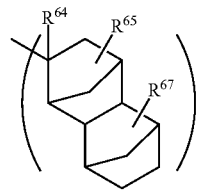
(AL-12)-9
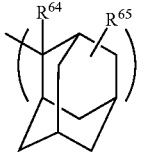
(AL-12)-10

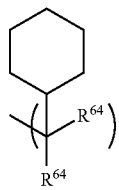
(AL-12)-11

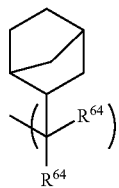
(AL-12)-12

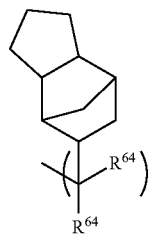
(AL-12)-13

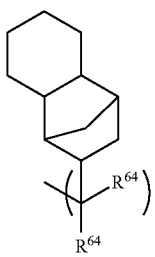
(AL-12)-14

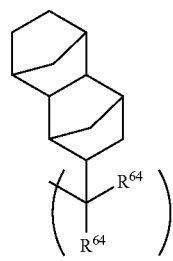
(AL-12)-15

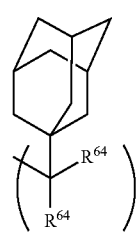
(AL-12)-16

Herein $R^{64}$ is independently a straight, branched or cyclic $C_1$-$C_8$ alkyl, $C_6$-$C_{20}$ aryl or $C_7$-$C_{20}$ aralkyl group, or two $R^{64}$ may bond together to form a ring. $R^{65}$ and $R^{67}$ each are hydrogen, methyl or ethyl. $R^{66}$ is a $C_6$-$C_{20}$ aryl or $C_7$-$C_{20}$ aralkyl group.

In the polymer comprising the aforementioned recurring units (a1), (a2) and (b) and serving as the shrink agent, additional recurring units (c) derived from such monomers as styrenes, vinylnaphthalenes, vinylanthracenes, acenaphthylenes, (meth)acrylates having an aromatic ester, and (meth)acrylates having a $C_6$-$C_{20}$ cyclic alkyl ester may be copolymerized, if necessary, for the purpose of controlling acid diffusion. These monomers may have a substituted or unsubstituted hydroxyl group. Also, further recurring units (d) derived from (meth)acrylates having an acid labile group-substituted carboxyl group or acid labile group-substituted hydroxyl group, or monomers having a carboxyl, hydroxyl, cyano, amide, imide, sulfonamide, ester, ether, lactone ring, carbonate or carbamate group may be copolymerized, if necessary, for the purpose of controlling solubility in the stripper solvent.

In the polymer, the recurring units (a1), (a2), (b), (c), and (d) are present in proportions a1, a2, b, c, and d, respectively, which satisfy the range:
$0 \leq a1 < 1.0$, $0 \leq a2 < 1.0$, $0 < a1+a2 < 1.0$, $0 < b < 1.0$, $0 \leq c \leq 0.8$, and $0 \leq d \leq 0.8$;
preferably $0 \leq a1 \leq 0.9$, $0 \leq a2 \leq 0.9$, $0.1 \leq a1+a2 \leq 0.9$, $0.1 \leq b \leq 0.9$, $0 \leq c \leq 0.7$, and $0 \leq d \leq 0.7$;
more preferably $0 \leq a1 \leq 0.85$, $0 \leq a2 \leq 0.85$, $0.2 \leq a1+a2 \leq 0.85$, $0.15 \leq b \leq 0.8$, $0 \leq c \leq 0.6$, and $0 \leq d \leq 0.6$; provided that $a1+a2+b+c+d=1$.

On the other hand, the base resin in the resist composition used to form a resist pattern is a polymer having an alkali solubility that increases under the action of an acid. To this end, the polymer should comprise recurring units having an acid labile group-substituted carboxyl group. These recurring units are effective for accelerating neutralization reaction with amino groups which are generated by the shrink agent during post-application bake.

Specifically, the recurring units having a carboxyl to group substituted with an acid labile group are represented by the general formula (2).

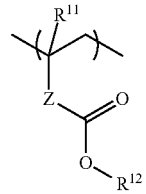
(2)

Herein $R^{11}$ is hydrogen or methyl. $R^{12}$ is an acid labile group. Z is a single bond or —C(=O)—O—$R^{13}$—, wherein $R^{13}$ is a straight, branched or cyclic $C_1$-$C_{10}$ alkylene group which may contain an ether or ester moiety, or a naphthylene group.

Examples of the acid labile group $R^{12}$ are as illustrated above for $R^7$.

The recurring units having an acid labile group-substituted carboxyl group are described, for example, in US 2014/170563 A1 (JP-A 2014-11965), paragraphs [0050]-[0098]. Further, the polymer as the base resin in the resist composition may comprise recurring units having an adhesive group selected from among hydroxyl, lactone ring, ether, ester, carbonyl and cyano groups as described in US 2014/170563 A1 (JP-A 2014-11965), paragraph [0100], and may further comprise recurring units derived from an indene, acenaphthylene, chromone, coumarin, and norbornadiene as described in paragraphs [0110]-[0111], a styrene, vinylnaphthalene, vinylanthracene, vinylpyrene, and methyleneindane as described in paragraph [0112], and also recurring units having an acid generator in the form of an onium salt having polymerizable olefin as described in paragraphs [0102]-[0104].

The following discussion applies to both the copolymer serving as the shrink agent and the polymer serving as the base resin in the resist composition, both used in the patterning process. The polymer should preferably have a weight average molecular weight (Mw) in the range of 1,000 to 500,000, and more preferably 2,000 to 100,000, as measured by GPC using polystyrene standards. If Mw is too low, in the case of shrink agent, the acid diffusion distance is so extended that the amount of shrinkage may become excessive or uncontrollable, and in the case of resist composition, the diffusion distance of acid generated by PAG may be extended to invite a drop of resolution. If Mw is too high, in the case of shrink agent, its solubility in stripper solvent may be reduced, leaving scum in spaces at the end of removal step, and in the case of resist composition, a footing phenomenon is likely to occur after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymers used herein may be synthesized by any desired method, for example, by dissolving monomers in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst and the resulting polymer be protected or partially protected.

Although the copolymer can serve as the shrink agent independent of whether recurring units (a1) and/or (a2) and recurring units (b) are copolymerized randomly or in blocks, block copolymerization is preferred because of improved CD uniformity of the pattern after shrinkage. When a block copolymer is applied as the shrink agent, hydrophilic units (b) having reacted with acid and carboxylic acid are arranged on the resist surface side and hydrophobic units (a1) and/or (a2) are arranged on the opposite side. The shrink agent having a self-assembling function as in the case of DSA is effective for significantly improving the CD uniformity of holes after development.

Where random copolymerization is carried out in a radical polymerization mode, it is a common practice to mix comonomers with a radical initiator and subject the mixture to heat polymerization. Specifically, polymerization of monomers (a1) and/or (a2) is started in the presence of a radical initiator, and monomer (b) is later added. There is obtained a polymer consisting of units (a1) and/or (a2) on one side and units (b) on the other side of its molecule. However, this polymer has a different architecture from the block copolymer because the intermediate portion is a mixture of units (a1) and/or (a2) and units (b). To form a block copolymer by radical polymerization, living radical polymerization is preferably used. In the living radical polymerization technique, known as reversible addition-fragmentation chain transfer (RAFT) polymerization, living radicals are always available at the polymer terminus. Then a block copolymer consisting of recurring units (a1) and/or (a2) and recurring units (b) can be formed by starting polymerization of a monomer (a1) and/or (a2) and adding monomer (b) at the stage when monomer (a1) and/or (a2) is consumed.

A chain transfer agent is necessary to perform RAFT polymerization. Examples of the chain transfer agent include 2-cyano-2-propyl benzodithioate, 4-cyano-4-phenylcarbonothioylthiopentanoic acid, 2-cyano-2-propyl dodecyltrithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl(phenyl)carbamothioate, bis(thiobenzoyl) disulfide, and bis(dodecylsulfanylthiocarbonyl) disulfide. Inter alia, 2-cyano-2-propyl benzodithioate is most preferred.

Alternatively, a block copolymer can be formed by living anion polymerization. In this case, an organometallic compound is used as the anion species, for example, alkyl lithium, alkyl magnesium halide, naphthalene sodium, and alkylated lanthanoid compounds. Inter alia, butyllithium and butylmagnesium chloride are preferred. The hydroxyl group on monomer (a1) must have been substituted before anionic polymerization can be performed. For example, the hydroxyl group is substituted with tert-BOC, acetal or trimethylsilyl group prior to polymerization, and polymerization is followed by deprotection with acid. Conditions for the deprotection step must be carefully selected so as to avoid deprotection of acid labile groups on recurring units (b).

The shrink agent used in the pattern forming process further contains an organic solvent and optionally a salt, basic compound and surfactant.

Typically, the shrink agent contains the copolymer of formula (1) in an organic solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms. Preferably, the organic solvent is selected such that the patterned resist film after development may experience a thickness loss of up to 10 nm when the film is kept in contact with the solvent for 30 seconds.

Examples of the ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms include di-n-butyl ether, diisobutyl ether, di-sec-butyl ether, di-n-pentyl ether, diisopentyl ether, di-sec-pentyl ether, di-tert-amyl ether, di-n-hexyl ether, methyl cyclopentyl ether, methyl cyclohexyl ether, methyl phenyl ether, methyl benzyl ether, ethyl cyclopentyl ether, ethyl cyclohexyl ether, ethyl phenyl ether, ethyl benzyl ether, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, benzene, toluene, xylene, mesitylene, ethylbezene, n-propylbenzene, cumene, n-butylbenzene, cymene, amylbenzene, diethylbenzene, octane, nonane, decane, turpentine oil, pinene, 2-octanone, 2-nonanone, 2-heptanone, 3-heptanone, 4-heptanone, 2-hexanone, 3-hexanone, diisobutyl ketone, methylcyclohexanone, acetophenone, methylacetophenone, ethyl n-butyl ketone, di-n-butyl ketone, diisobutyl ketone, amyl phoronate, amyl acetate, isoamyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, amyl valerate, isoamyl valerate, ethyl isovalerate, propyl isovalerate, isopropyl isovalerate, butyl isovalerate, isobutyl isovalerate, tert-butyl isovalerate, isoamyl isovalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, propyl butyrate, butyl butyrate, isobutyl butyrate, tert-butyl butyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate, which may be used alone or in admixture of two or more.

Of the organic solvents, ether solvents of 8 to 12 carbon atoms are preferred because the resist pattern is not dissolved therein. If a solvent which can be used in the resist composition are used in the shrink agent, there may arise a problem that when the shrink agent is applied onto the resist pattern, the shrink agent can be intermixed with the resist pattern whereby the resist pattern is dissolved away. To avoid this problem, ether solvents of 8 to 12 carbon atoms in which the polymer in the resist composition is not dissolvable are preferably used as the shrink agent. Exemplary of the ether solvents of 8 to 12 carbon atoms are di-n-butyl ether, diisobutyl ether, di-sec-butyl ether, di-n-pentyl ether, diisopentyl ether, di-sec-pentyl ether, di-tert-amyl ether, and di-n-hexyl ether, which may be used alone or in admixture of two or more.

In the shrink agent solution, the solvent is preferably used in an amount of 100 to 100,000 parts, more preferably 200 to 50,000 parts by weight per 100 parts by weight of the copolymer.

To the shrink agent, a salt and basic compound may be added if desired. The salt that can be added is typically selected from sulfonium salts and iodonium salts which are typically added to resist compositions, and ammonium salts.

The basic compound that can be added may be selected from those basic compounds which are typically added to resist compositions, for example, primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives. The addition of the salt or basic compound is effective for suppressing excessive diffusion of acid from within the resist film and for controlling the amount of shrinkage. The surfactant that can be added may be selected from those surfactants which are typically added to resist compositions.

In the shrink agent, preferably the salt is used in an amount of 0 to 50 parts by weight, the basic compound is used in an amount of 0 to 30 parts by weight, and the surfactant is used in an amount of 0 to 10 parts, more preferably 0 to 5 parts by weight, all per 100 parts by weight of the copolymer. When added, each additive is preferably used in an amount of at least 0.1 part by weight.

The resist composition comprises the polymer as base resin, an organic solvent, and an acid generator (i.e., compound capable of generating an acid in response to high-energy radiation), and optionally, a dissolution regulator, basic compound, surfactant, acetylene alcohol, and other components.

Specifically, the resist composition contains an acid generator such that it may function as a chemically amplified resist composition. The acid generator is typically a compound capable of generating an acid in response to actinic light or radiation, known as photoacid generator (PAG). An appropriate amount of the PAG used is 0.5 to 30 parts, more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary of the acid generated by PAG are sulfonic acids, imidic acids and methide acids. Of these, sulfonic acids which are fluorinated at α-position are most commonly used. Where the acid labile group is an acetal group susceptible to deprotection, fluorination at α-position is not always necessary. Where the base polymer has recurring units of acid generator copolymerized therein, the acid generator need not be separately added.

Examples of the organic solvent used herein are described in JP-A 2008-111103, paragraphs [0144] to [0145](U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butane diol or 1,3-butane diol may be added for accelerating deprotection reaction of acetal.

Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649. Also, onium salts such as sulfonium salts, iodonium salts and ammonium salts of sulfonic acids which are not fluorinated at α-position as described in US 2008153030 (JP-A 2008-158339) and similar onium salts of carboxylic acid as described in JP 3991462 may be used as the quencher.

Where the acid labile group is an acetal group which is very sensitive to acid, the acid for eliminating the protective group need not necessarily be a sulfonic acid which is fluorinated at α-position, imidic acid or methide acid. Even with a sulfonic acid which is not fluorinated at α-position, deprotection reaction may take place in some cases. Since an onium salt of sulfonic acid cannot be used as the quencher in this event, an onium salt of imidic acid is preferably used alone.

Exemplary surfactants are described in JP-A 2008-111103, paragraphs [0165]-[0166]. Exemplary dissolution regulators are described in JP-A 2008-122932 (US 2008090172), paragraphs [0155]-[0178], and exemplary acetylene alcohols in paragraphs [0179]-[0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin.

The dissolution regulator, surfactant and acetylene alcohol may be used in any suitable amounts, depending on their purpose of addition.

Figure 2E:
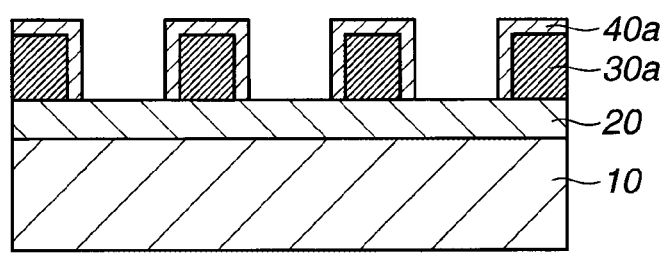
Figure 2F:
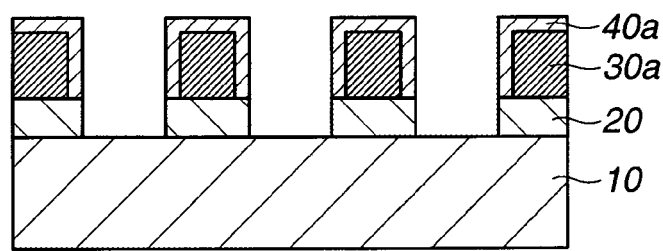

Referring to FIGS. 1 and 2, the pattern shrinking process of the invention is described. First, as shown in FIG. 1 (A), a chemically amplified resist composition is applied onto a processable substrate 20 on a substrate 10 to form a photoresist film 30 thereon. If necessary, a hard mask layer (not shown) may intervene between the resist film 30 and the processable substrate 20. By standard techniques, the resist film 30 is subjected to exposure (FIG. 1 (B)), PEB, and organic solvent development to form a negative resist pattern 30*a* (FIG. 1 (C)). A shrink agent 40 is applied onto the negative resist pattern 30*a* to cover the pattern as shown in FIG. 2 (D). This is followed by bake, the heat of which causes acid diffusion from the resist pattern 30*a* to the shrink agent 40. This induces deprotection reaction to the polymer in the shrink agent. Thereafter, a solvent stripper is applied to remove the excessive shrink agent 40, leaving a shrink agent film 40 over the resist pattern 30*a*. This means that the resist pattern 30*a* is thickened with the shrink agent film 40*a*, that is, the width of spaces in the resist pattern is shrunk as shown in FIG. 2 (E). Using the shrunk pattern as a mask, the processable substrate 20 is dry etched as shown in FIG. 2 (F).

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask may be of $SiO_2$, SiN, SiON or p-Si. Sometimes, an undercoat in the form of carbon film or a silicon-containing intermediate film may be laid instead of the hard mask, and an organic antireflective coating may be interposed between the hard mask and the resist film.

While a resist film (30) of a chemically amplified resist composition is formed on a processable substrate (20) on a substrate (10) directly or via an intermediate intervening layer as mentioned above, the resist film preferably has a thickness of 10 to 1,000 nm and more preferably 20 to 500 nm. Prior to exposure, the resist film is heated or prebaked, preferably at a temperature of 50 to 180° C., especially 60 to 150° C. for a time of 10 to 300 seconds, especially 15 to 200 seconds.

Next the resist film is exposed. For the exposure, preference is given to high-energy radiation having a wavelength of 140 to 250 nm, especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the prebaked resist film is exposed to light through a projection lens, with pure water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of 4 to 10 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably performed in an exposure dose of about 1 to 200 $mJ/cm^2$, more preferably about 10 to 100 $mJ/cm^2$. This is followed by baking (PEB) on a hot plate at 50 to 150° C. for 1 to 5 minutes, preferably at 60 to 120° C. for 1 to 3 minutes.

Thereafter the exposed resist film is developed with a developer consisting of an organic solvent for 0.1 to 3 minutes, preferably 0.5 to 2 minutes by any conventional techniques such as dip, puddle and spray techniques. In this way, a negative resist pattern is formed on the substrate.

The organic solvent used as developer is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film may be rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable aromatic solvents include toluene, xylene, ethylbenzene, isopropylbenzene, t-butylbenzene, and mesitylene. The solvents may be used alone or in admixture. After the rinse liquid is applied, the substrate may be dried by spin drying and bake. However, rinsing is not essential. As long as the step of spin drying the substrate after the developer is applied thereto is included, the rinsing step may be omitted.

Following the development, the shrink agent of the invention is applied onto the resist pattern to form a shrink agent coating, preferably having a thickness of 1 to 100 nm, more preferably 1.5 to 50 nm. The shrink agent coating is baked at a temperature of 40 to 150° C. for 5 to 300 seconds for letting the solvent evaporate off and causing acid diffusion from the resist film to the shrink agent, deprotection reaction, and neutralization reaction of amino groups generated in the shrink agent for thereby bonding the shrink agent coating to the resist film.

Finally, the excessive shrink agent is removed, preferably using the same solvent as used in the shrink agent. The stripper solvent is preferably selected from among ether solvents of 6 to 12 carbon atoms, alcohol solvents of 4 to 10 carbon atoms, hydrocarbon solvents of 6 to 12 carbon atoms, ester solvents of 6 to 16 carbon atoms, ketone solvents of 7 to 16 carbon atoms, and mixtures thereof.

EXAMPLE

Examples of the invention are given below by way of illustration and not by way of limitation. The abbreviation "pbw" is parts by weight, and PGMEA is propylene glycol monomethyl ether acetate. For all polymers, Mw and Mn are determined by GPC versus polystyrene standards.

Synthesis Example 1

Polymers (for use in shrink agents and resist compositions) were synthesized by combining suitable monomers in tetrahydrofuran solvent, effecting copolymerization reaction, crystallizing from methanol, repeatedly washing with hexane, isolation and drying. There were obtained random copolymers, designated Polymers 1 to 12, Comparative Polymers 1, 2, Resist Polymer 1, Water-repellent Polymer 1. The polymers were analyzed for composition by $^1$H-NMR spectroscopy and for Mw and Mw/Mn by GPC. The polymers are identified below with their analytical data.

Polymer 1

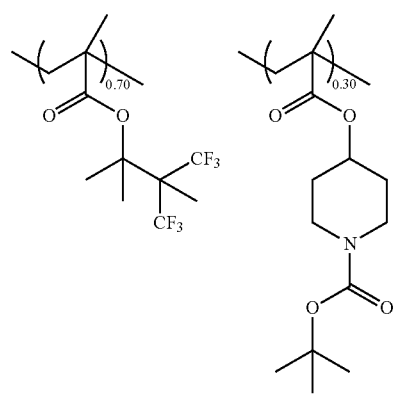

Polymer 1

Mw = 15,800
Mw/Mn = 1.94

Polymer 2

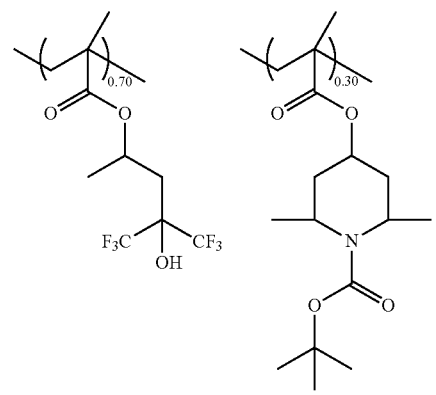

Polymer 2

Mw = 26,000
Mw/Mn = 1.77

Polymer 3
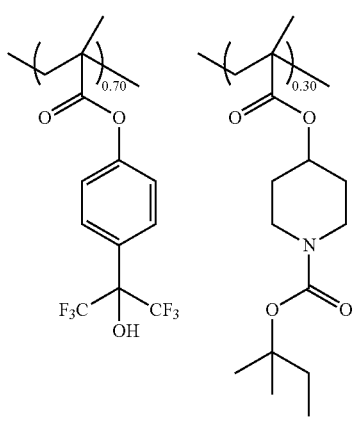
Mw = 26,000
Mw/Mn = 1.84
Polymer 4
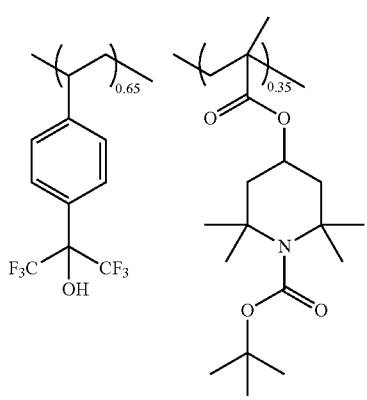
Mw = 9,400
Mw/Mn = 1.94
Polymer 5
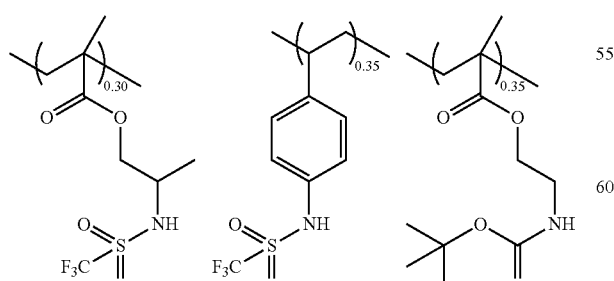
Mw = 7,200
Mw/Mn = 1.64
Polymer 6
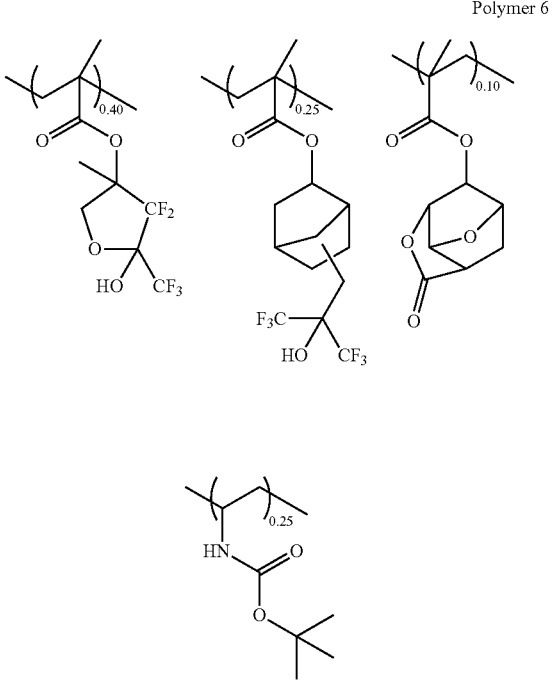
Mw = 7,100
Mw/Mn = 1.71
Polymer 7
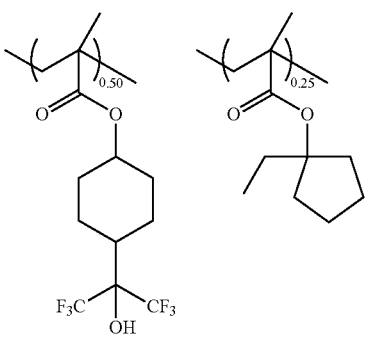
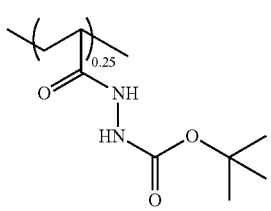
Mw = 9,900
Mw/Mn = 1.97

Polymer 8
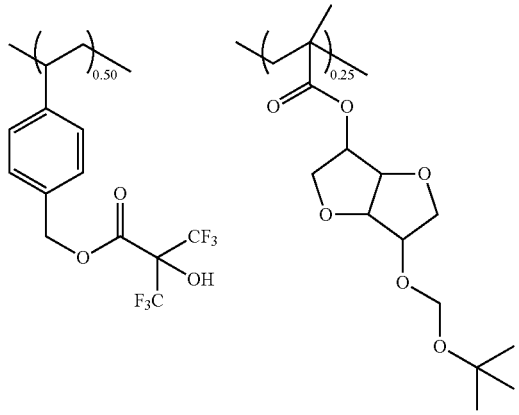
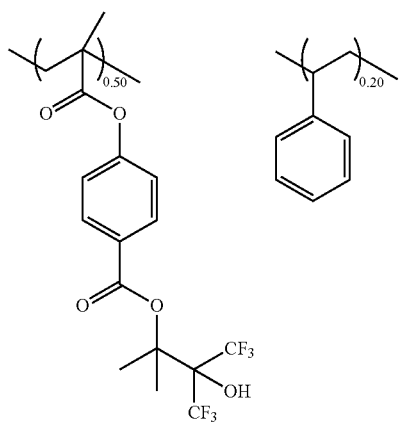
Mw = 7,500
Mw/Mn = 1.76
Polymer 9
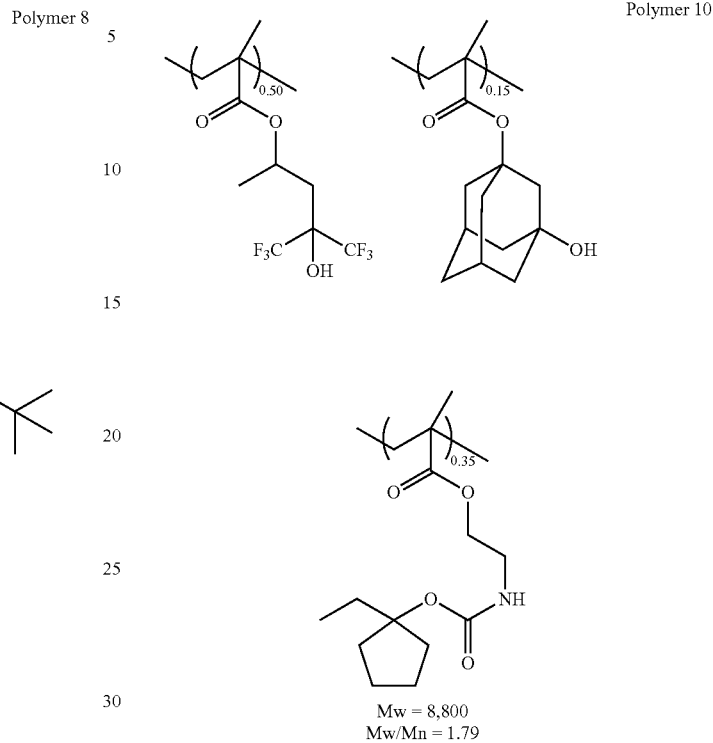
Mw = 10,300
Mw/Mn = 1.92
Polymer 10
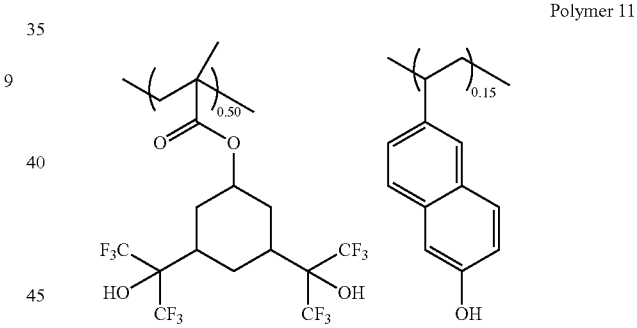
Mw = 8,800
Mw/Mn = 1.79
Polymer 11
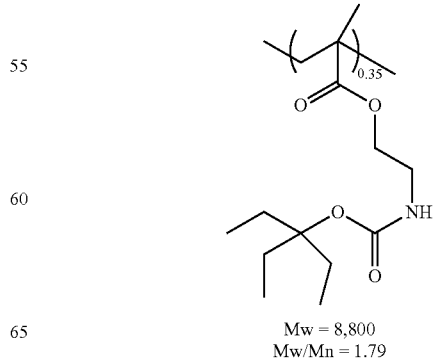
Mw = 8,800
Mw/Mn = 1.79

Polymer 12

Mw = 25,800
Mw/Mn = 1.91

Comparative Polymer 1

Mw = 7,800
Mw/Mn = 1.68

Comparative Polymer 2

Mw = 8,100
Mw/Mn = 1.82

Resist Polymer 1

Mw = 7,500
Mw/Mn = 1.61

Water-repellent Polymer 1

Mw = 7,800
Mw/Mn = 1.55

Synthesis Example 2

As the polymer for use in shrink agent, Block Copolymer 1 was prepared by RAFT polymerization. In a nitrogen atmosphere, 16 g of 4,4,4-trifluoro-3-hydroxy-2-methyl-3-trifluoromethylbutan-2-yl methacrylate, 0.15 g of 2-cyano-2-propyl benzodithioate, and 0.04 g of 2,2'-azobisisobutyronitrile were dissolved in 11 g of methyl ethyl ketone. In the nitrogen atmosphere, the solution was stirred at 80° C. for 4 hours. Subsequently, a solution of 3 g of 1-(tert-butoxycarbonyl)piperidin-4-yl methacrylate in 3 g of methyl ethyl ketone was added dropwise to the reaction solution, which was stirred at 80° C. for a further 4 hours. The polymerization solution was cooled to room temperature and added dropwise to 300 g of hexane. The precipitated solid matter was collected by filtration, washed with 120 g of hexane, and vacuum dried at 60° C. for 15 hours, yielding Block Copolymer 1 as identified below.

Block Copolymer 1

Mw = 16,000
Mw/Mn = 1.20

Examples 1 to 16 and Comparative Examples 1 to 3

A shrink agent solution was prepared by mixing the polymer synthesized above (Polymers 1 to 12, Comparative Polymers 1, 2, or Block Copolymer 1), a sulfonium salt or amine quencher, and solvent in accordance with the formulation of Table 1, and filtering through a Teflon® filter having a pore size of 0.2 m. Notably, in the preparation of Comparative Shrink agent 2, Comparative Polymer 2 could not be dissolved in the solvent.

Components shown in Table 1 are identified below.

Sulfonium salt 1 and Amine quencher 1 of the following structural formulae

Sulfonium salt 1

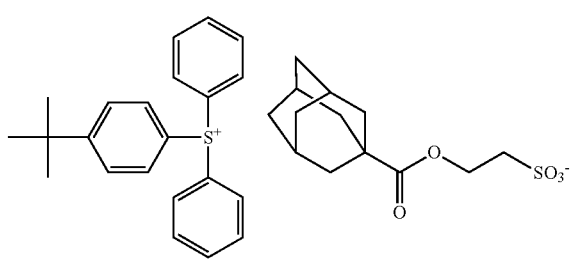

Amine quencher 1

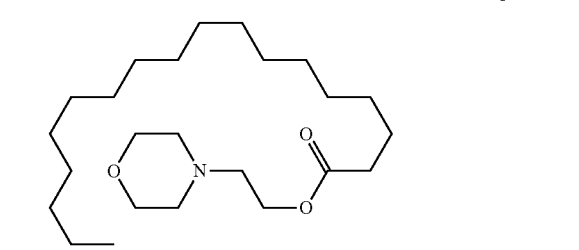

TABLE 1

| Shrink agent | Polymer (pbw) | Additive (pbw) | Organic solvent (pbw) |
|---|---|---|---|
| Shrink agent 1 | Polymer 1 (100) | — | 4-methyl-2-pentanol (3,000) |
| Shrink agent 2 | Polymer 2 (100) | — | diisoamyl ether(300) 4-methyl-2-pentanol (2,800) |
| Shrink agent 3 | Polymer 3 (100) | — | di-n-pentyl ether(3,000) 2-methyl-1-butanol(500) |
| Shrink agent 4 | Polymer 4 (100) | — | di-n-butyl ether(3,000) 3-methyl-1-butanol(500) |
| Shrink agent 5 | Polymer 5 (100) | — | di-n-butyl ether(3,600) 3-methyl-1-butanol(500) |
| Shrink agent 6 | Polymer 6 (100) | — | di-sec-pentyl ether (3,000) 3-methyl-3-pentanol(400) |
| Shrink agent 7 | Polymer 7 (100) | — | diisoamyl ether(1,600) 4-methyl-2-pentanol (1,000) |
| Shrink agent 8 | Polymer 8 (100) | — | diisoamyl ether(1,600) 2-methyl-2-pentanol(600) |

TABLE 1-continued

| Shrink agent | Polymer (pbw) | Additive (pbw) | Organic solvent (pbw) |
|---|---|---|---|
| Shrink agent 9 | Polymer 9 (100) | — | diisoamyl ether(1,600) 2-methyl-2-pentanol(600) |
| Shrink agent 10 | Polymer 10 (100) | — | diisoamyl ether(2,500) isobutyl alcohol(300) |
| Shrink agent 11 | Polymer 11 (100) | — | diisoamyl ether(1,600) 4-methyl-2-pentanol (1,000) |
| Shrink agent 12 | Block Copolymer 1 (100) | — | diisoamyl ether(1,600) 4-methyl-2-pentanol (1,000) |
| Shrink agent 13 | Polymer 1 (100) | Sulfonium salt 1 (2.0) | diisoamyl ether(1,600) 4-methyl-2-pentanol (1,000) |
| Shrink agent 14 | Polymer 1 (100) | Amine quencher 1 (0.5) | diisoamyl ether(1,600) 4-methyl-2-pentanol (1,000) |
| Shrink agent 15 | Polymer 12 (100) | — | diisoamyl ether(1,600) 4-methyl-2-pentanol (1,000) |
| Comparative shrink agent 1 | Comparative Polymer 1 (100) | — | 4-methyl-2-pentanol (3,000) |
| Comparative shrink agent 2 | Comparative Polymer 2 (100) | — | 4-methyl-2-pentanol (3,000) |
| Comparative shrink agent 3 | Polymer 1 (100) | — | PGMEA (3,000) |
| Comparative shrink agent 4 | Polymer 1 (100) | — | butyl acetate (3,000) |

Note:
PGMEA (propylene glycol monomethyl ether acetate)

Preparation of Resist Composition

A resist composition in solution form was prepared by dissolving a polymer (Resist Polymer 1), acid generator, sulfonium salt, amine quencher, and water-repellent polymer in a solvent in accordance with the formulation of Table 2, and filtering through a filter with a pore size of 0.2 m. The solvent contained 100 ppm of surfactant FC-4430 (3M-Sumitomo Co., Ltd.).

Acid generator: PAG1 of the following structural formula

PAG 1

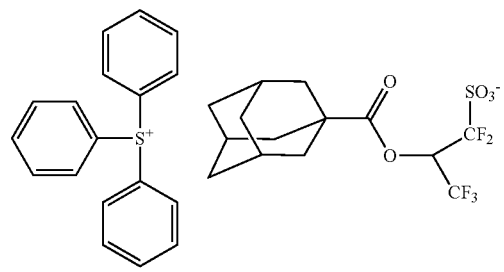

TABLE 2

| Resist | Polymer (pbw) | Acid generator (pbw) | Quencher (pbw) | Water repellent (pbw) | Organic solvent (pbw) |
|---|---|---|---|---|---|
| Resist 1 | Resist Polymer 1 (100) | PAG 1 (5.0) | Sulfonium salt 1 (5.0) | Water-repellent polymer 1 (3.0) | PGMEA(2,500) γ-butyrolactone(200) |
| Resist 2 | Resist Polymer 1 (100) | PAG 1 (10.0) | Amine quencher 1 (2.0) | Water-repellent polymer 1 (3.0) | PGMEA(2,500) γ-butyrolactone(200) |

ArF Lithography Patterning Test

On a silicon wafer, a spin-on carbon film ODL-102 (Shin-Etsu Chemical Co., Ltd.) was deposited to a thickness of 200 nm and a silicon-containing spin-on hard mask SHB-A940 was deposited thereon to a thickness of 35 nm. On this substrate for trilayer process, the resist composition in Table 2 was spin coated, then baked on a hot plate at 100° C. for 60 seconds to form a resist film of 100 nm thick. Using an ArF excimer laser immersion lithography scanner NSR-610C (Nikon Corp., NA 1.30, σ 0.98/0.78, dipole opening 20 deg., azimuthally polarized illumination), the resist film was exposed through a 6% halftone phase shift mask while varying the exposure dose. After the exposure, the resist film was baked (PEB) at 90° C. for 60 seconds and puddle developed in n-butyl acetate for 30 seconds to form a trench pattern having a space width of 45 nm and a pitch of 100 nm.

Next the shrink agent shown in Table 1 was applied onto the resist pattern after development to cover the pattern. The shrink agent coating was baked at the temperature shown in Table 3 for 60 seconds. While the wafer was spun at 200 rpm, 4-methyl-2-pentanol was dispensed on the wafer to strip off the excessive shrink agent. Both after development and after shrink treatment, the pattern was observed under a CD-SEM (CG-4000 by Hitachi, Ltd.) to measure the size of trenches at a pitch of 100 nm and LER. The results are shown in Table 3.

TABLE 3

| | | Resist | Trench size after development (nm) | LER after development (3σ, nm) | Shrink agent | Bake temp. (° C.) | Trench size after removal of shrink agent (nm) | LER after removal of shrink agent (3σ, nm) |
|---|---|---|---|---|---|---|---|---|
| Example | 1 | Resist 1 (100) | 45 | 2.7 | Shrink agent 1 | 120 | 29 | 2.3 |
| | 2 | Resist 2 (100) | 46 | 3.3 | Shrink agent 1 | 110 | 32 | 3.1 |
| | 3 | Resist 1 (100) | 45 | 2.7 | Shrink agent 2 | 110 | 28 | 2.7 |
| | 4 | Resist 1 (100) | 45 | 2.7 | Shrink agent 3 | 130 | 32 | 2.7 |
| | 5 | Resist 1 (100) | 45 | 2.7 | Shrink agent 4 | 130 | 33 | 2.5 |
| | 6 | Resist 1 (100) | 45 | 2.7 | Shrink agent 5 | 130 | 31 | 2.4 |
| | 7 | Resist 1 (100) | 45 | 2.7 | Shrink agent 6 | 120 | 34 | 2.6 |
| | 8 | Resist 1 (100) | 45 | 2.7 | Shrink agent 7 | 130 | 35 | 2.6 |
| | 9 | Resist 1 (100) | 45 | 2.7 | Shrink agent 8 | 110 | 33 | 2.5 |
| | 10 | Resist 1 (100) | 45 | 2.7 | Shrink agent 9 | 110 | 35 | 2.5 |
| | 11 | Resist 1 (100) | 45 | 2.7 | Shrink agent 10 | 90 | 33 | 2.6 |
| | 12 | Resist 1 (100) | 45 | 2.7 | Shrink agent 11 | 110 | 29 | 1.9 |
| | 13 | Resist 1 (100) | 45 | 2.7 | Shrink agent 12 | 110 | 31 | 2.3 |
| | 14 | Resist 1 (100) | 45 | 2.7 | Shrink agent 13 | 110 | 32 | 2.5 |
| | 15 | Resist 1 (100) | 45 | 2.7 | Shrink agent 14 | 110 | 34 | 2.6 |
| | 16 | Resist 1 (100) | 45 | 2.5 | Shrink agent 15 | 110 | 31 | 2.6 |
| Comparative Example | 1 | Resist 1 (100) | 45 | 2.7 | Comparative shrink agent 1 | 110 | 47 | 3.8 |
| | 2 | Resist 1 (100) | 45 | 2.7 | Comparative shrink agent 3 | 110 | pattern vanished | — |
| | 3 | Resist 1 (100) | 45 | 2.7 | Comparative shrink agent 4 | 110 | 42 | 4.5 |

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application No. 2013-200122 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of: applying a resist composition comprising a polymer comprising recurring units having an acid labile group-substituted carboxyl group, an acid generator and an organic solvent onto a substrate,
prebaking to form a resist film,
exposing the resist film to high-energy radiation,
baking the film,
developing the exposed resist film in an organic solvent-based developer to form a negative pattern,
applying a shrink agent onto the negative pattern, the shrink agent being a solution of a copolymer comprising recurring units having an α-trifluoromethylhydroxy and/or fluoroalkylsulfonamide group and recurring units having an acid labile group-substituted amino group in a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms,
baking, and
removing the excessive shrink agent for thereby shrinking the size of spaces in the pattern.

2. The pattern forming process of claim 1 wherein the copolymer comprising recurring units having an α-trifluoromethylhydroxy and/or fluoroalkylsulfonamide group and recurring units having an acid labile group-substituted amino group has the general formula (1):

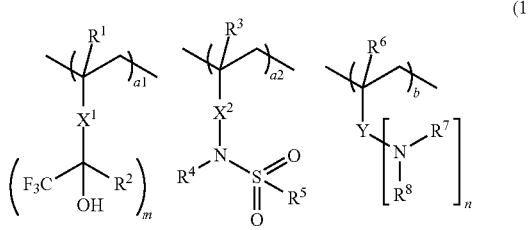

wherein $R^1$, $R^3$, and $R^6$ each are hydrogen or methyl, m is 1 or 2, $X^1$ in case that m is 1 and $X^2$ each are phenylene or —C(=O)—O—$R^9$—, $R^9$ is a straight, branched or cyclic $C_1$-$C_{10}$ alkylene group which may contain an ether or ester moiety, $C_6$-$C_{10}$ arylene group, or $C_2$-$C_{10}$ alkenylene group, or $X^1$ in case that m is 2 is a trivalent group in which one hydrogen atom is eliminated from $X^1$ in case that m is 1, $R^2$ is hydrogen, fluorine, methyl, trifluoromethyl, or difluoromethyl, $R^2$ may bond with $X^1$ to form a $C_1$-$C_6$ ring which may contain a fluorine atom or ether moiety, $R^4$ is hydrogen or a $C_1$-$C_4$ alkyl group, $R^5$ is a straight, branched or cyclic $C_1$-$C_{10}$ alkyl group or $C_6$-$C_{10}$ aryl group which has at least one fluorine atom, n is 1 or 2, Y in case that n is 1 is a single bond, —C(=O)—O—$R^{10}$— or —C(=O)—NH—, $R^{10}$ is a single bond, a straight, branched or cyclic $C_1$-$C_{10}$ alkylene group which may contain an ether moiety, ester moiety, —N= or —S—, or a phenylene group or naphthylene group, or Y in case that n is 2 is a trivalent group in which one hydrogen atom is eliminated from Y in case that n is 1, $R^7$ is an acid labile group, $R^8$ is hydrogen, $C_1$-$C_4$ alkyl group or acid labile group, $R^8$ may bond with Y to form a $C_3$-$C_{10}$ ring, $0 \leq a1 < 1.0$, $0 \leq a2 < 1.0$, $0 < a1+a2 < 1.0$, and $0 < b < 1.0$.

3. The pattern forming process of claim 2 wherein the recurring units (a1) and/or (a2) and the recurring units (b) form a block copolymer.

4. The pattern forming process of claim 1 wherein the solvent of the shrink agent is selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms, such that the patterned resist film after development may experience a thickness loss of up to 10 nm when the film is kept in contact with the solvent for 30 seconds.

5. The pattern forming process of claim 1 wherein the solvent of the shrink agent is selected from the group consisting of di-n-butyl ether, diisobutyl ether, di-sec-butyl ether, di-n-pentyl ether, diisopentyl ether, di-sec-pentyl ether, di-tert-amyl ether, di-n-hexyl ether, methyl cyclopentyl ether, methyl cyclohexyl ether, methyl phenyl ether, methyl benzyl ether, ethyl cyclopentyl ether, ethyl cyclohexyl ether, ethyl phenyl ether, ethyl benzyl ether, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, benzene, toluene, xylene, mesitylene, ethylbezene, n-propylbenzene, cumene, n-butylbenzene, cymene, amylbenzene, diethylbenzene, octane, nonane, decane, turpentine oil, pinene, 2-octanone, 2-nonanone, 2-heptanone, 3-heptanone, 4-heptanone, 2-hexanone, 3-hexanone, diisobutyl ketone, methylcyclohexanone, acetophenone, methylacetophenone, ethyl n-butyl ketone, di-n-butyl ketone, diisobutyl ketone, amyl phoronate, amyl acetate, isoamyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, amyl valerate, isoamyl valerate, ethyl isovalerate, propyl isovalerate, isopropyl isovalerate, butyl isovalerate, isobutyl isovalerate, tert-butyl isovalerate, isoamyl isovalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, propyl butyrate, butyl butyrate, isobutyl butyrate, tert-butyl butyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, 2-phenylethyl acetate, and a mixture thereof.

6. The pattern forming process of claim 1 wherein the removing step uses a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms.

7. The pattern forming process of claim 1 wherein the polymer in the resist composition comprises recurring units having the general formula (2):

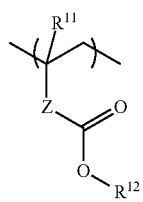

(2)

wherein $R^{11}$ is hydrogen or methyl, $R^{12}$ is an acid labile group, Z is a single bond or —C(=O)—O—$R^{13}$—, $R^{13}$ is a straight, branched or cyclic $C_1$-$C_{10}$ alkylene group which may contain an ether or ester moiety, or naphthylene group.

8. The pattern forming process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

* * * * *